United States Patent
Ohbayashi et al.

(10) Patent No.: US 6,741,510 B2
(45) Date of Patent: May 25, 2004

(54) SEMICONDUCTOR MEMORY DEVICE CAPABLE OF PERFORMING BURN-IN TEST AT HIGH SPEED

(75) Inventors: Shigeki Ohbayashi, Hyogo (JP); Yoji Kashihara, Hyogo (JP); Takahiro Yokoyama, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/223,326

(22) Filed: Aug. 20, 2002

(65) Prior Publication Data

US 2003/0161204 A1 Aug. 28, 2003

(30) Foreign Application Priority Data

Feb. 22, 2002 (JP) ........................................ 2002-046334

(51) Int. Cl.⁷ .................................................. G11C 7/00
(52) U.S. Cl. ............................. 365/201; 365/51; 365/63
(58) Field of Search ............................. 365/201, 51, 63

(56) References Cited

U.S. PATENT DOCUMENTS 5,400,282 A * 3/1995 Suzuki et al. ............... 365/201

FOREIGN PATENT DOCUMENTS

| JP | 5-159568 | 6/1993 |
|---|---|---|
| JP | 2001-14892 | 1/2001 |
| JP | 2001-184897 | 7/2001 |

* cited by examiner

*Primary Examiner*—Huan Hoang
(74) *Attorney, Agent, or Firm*—McDermott, Will & Emery

(57) ABSTRACT

A control circuit generates burn-in test signals and a signal on the basis of an address for causing transition of a semiconductor memory device to a burn-in test mode to output the signals to a predecoder. The predecoder outputs signals for selecting even-numbered word lines and signals for causing odd-numbered word lines to be in a non-selected state on the basis of the burn-in test signals at H level and further outputs signals for causing even-numbered word lines to be in a non-selected state and signals for selecting odd-numbered word lines on the basis of the burn-in test signals at H level. As a result, stresses can be effectively applied by the burn-in test.

11 Claims, 24 Drawing Sheets

(A)

(B)

3. EVEN-NUMBERED WL = 1, ODD-NUMBERED WL = 0, WRITTEN WITH "0", ALL-0

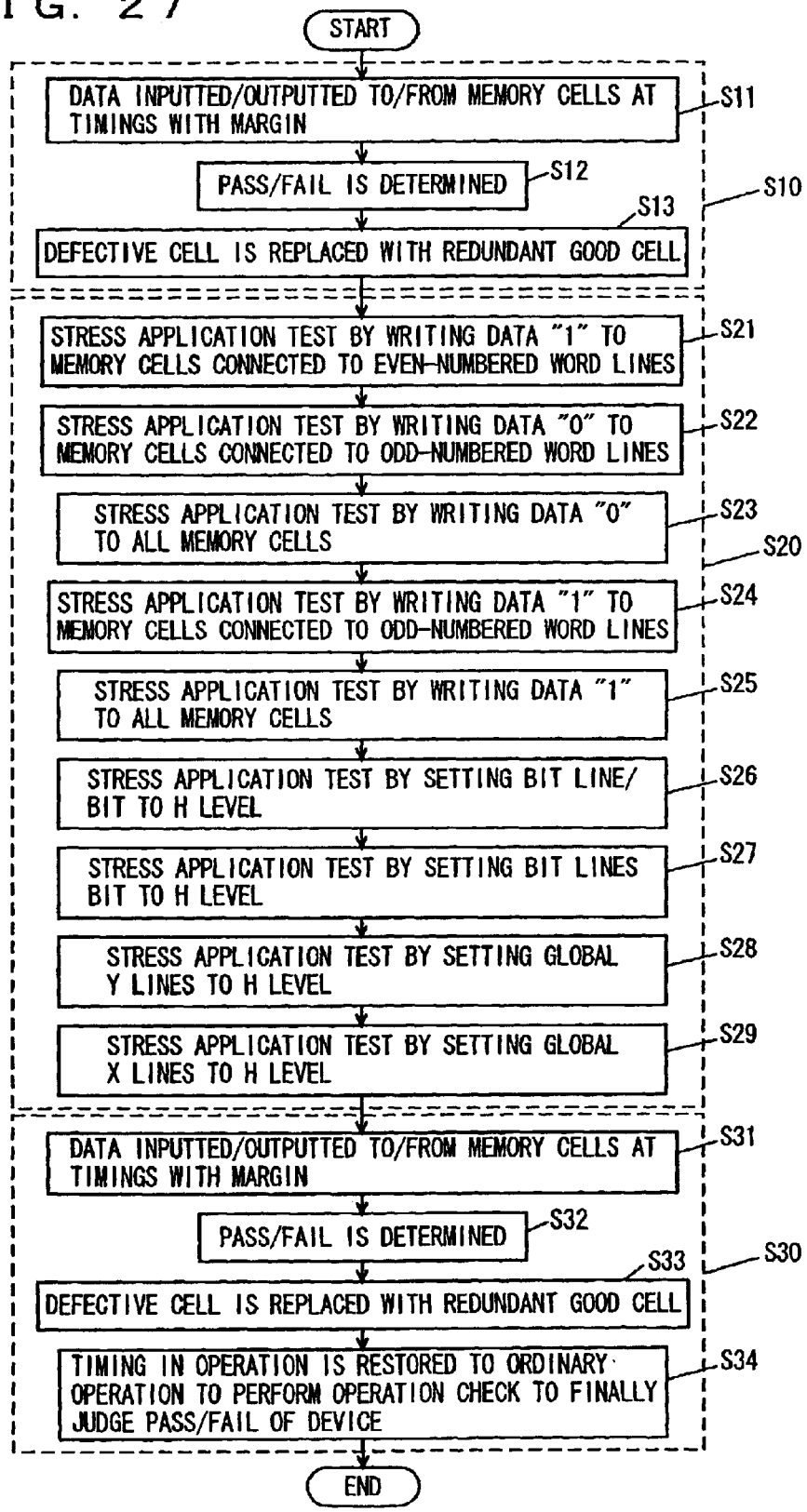

SEMICONDUCTOR MEMORY DEVICE CAPABLE OF PERFORMING BURN-IN TEST AT HIGH SPEED

BACKGROUND OF THE INVENTION

1. Field of the Invention

The present invention relates to a semiconductor memory device capable of performing a burn-in test at high speed.

2. Description of the Background Art

As semiconductor memory devices storing data to a high capacity, SRAM (Static Random Access Memory), DRAM (Dynamic Random Access Memory) and others have been put into practical use.

The semiconductor memory devices are shipped after judgement on pass/fail. The judgement on pass/fail of a semiconductor memory device as fabricated is performed by actually inputting/outputting data to/from memory cells included in the device to confirm that write data and read data coincide with each other and by applying a stress thereto in burn-in.

In company with the recent advent of a high capacity semiconductor memory device, however, portions requiring a stress to be applied thereto increase, which causes a test time for burn-in to be longer, having lead to a problem of a high cost.

In order to solve such a problem, a technique is disclosed in Japanese Patent laying-Open No. 5-159568 that plural word lines are simultaneously selected in a burn-in test for application of a stress.

Furthermore, a technique is disclosed in Japanese Patent Laying-Open No. 2001-184897 that a burn-in test signal is inputted to a predecoder and signals for selecting plural word lines are generated by the predecoder to activate the plural word lines simultaneously for application of a burn-in stress.

Moreover, a technique is disclosed in Japanese Patent Laying-Open No. 2001-14892 that even-numbered word lines and odd-numbered word lines are selectively activated for application of a burn-in stress.

The prior art techniques disclosed in Japanese Patent Laying-Open Nos. 5-159568, 2001-184897 and 2001-14892 contribute to reduction in test time for burn-in, while more effective application of a stress in burn-in is not sufficiently achieved therewith. If an effective application of a stress in burn-in is intended with the prior art techniques, a necessity arises for more of inspection circuits in a semiconductor memory device, leading to a problem of increase in area thereof.

SUMMARY OF THE INVENTION

It is accordingly an object of the present invention to provide a semiconductor memory device capable of effectively applying a stress by a burn-in test.

According to an aspect of the present invention, a semiconductor memory device includes: a memory cell array; and a test circuit consecutively applying plural stresses to the memory cell array in response to a transition request to a burn-in test mode.

In the burn-in test, the plural stresses are consecutively applied to the memory cell array.

According to the present invention, therefore, a time for a burn-in test can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 27 is a flowchart for describing a test method of a semiconductor memory device.

DESCRIPTION OF THE PREFERRED EMBODIMENTS

Detailed description will be given of embodiments of the present invention with reference to the accompanying drawings. Note that the same symbols are attached to the same or corresponding constituents in the figures and none of descriptions thereof is repeated.

Figure 1:
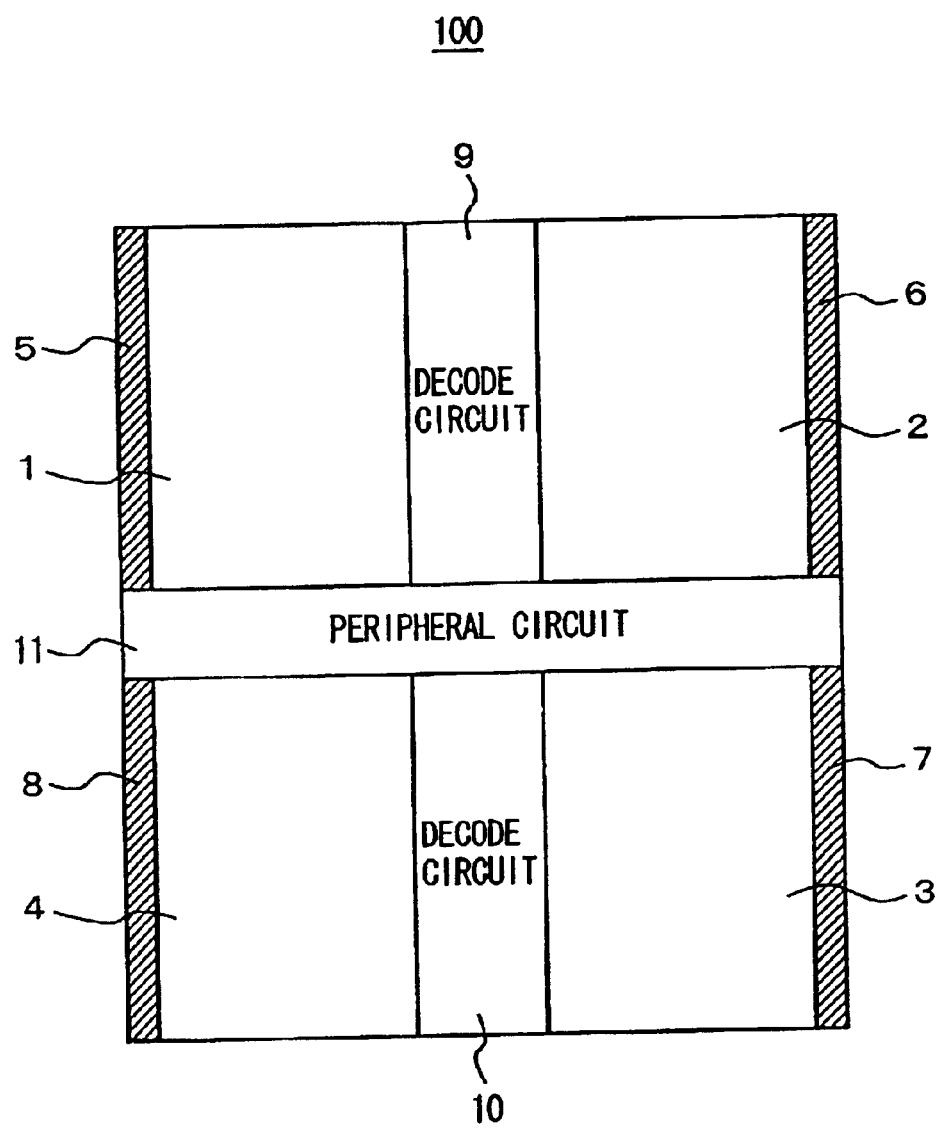
FIG. 1 is a schematic block diagram of a semiconductor memory device according to the present invention.

Referring to FIG. 1, a semiconductor memory device 100 includes: mats 1 to 4; read register/write drivers 5 to 8; decode circuits 9 and 10; and a peripheral circuit 11. Note that in the following description, semiconductor memory device 100 is assumed to be SRAM as an example.

Mats 1 and 2, and decode circuit 9 are placed between read register/write driver 5 and read register/write driver 6 and decode circuit 9 is placed between mats 1 and 2.

Mats 3 and 4, and decode circuit 10 are placed between read register/write driver 7 and read register/write driver 8 and decode circuit 10 is placed between mats 3 and 4.

Peripheral circuit 11 is placed between a set of mats 1 and 2, read register/write drivers 5 and 6, and decode circuit 9 and a set of mats 3 and 4, read register/write drivers 7 and 8, and decode circuit 10.

Mats 1 to 4 includes plural memory cells, plural word lines, plural bit line pairs, plural global word lines, plural global bit line pairs and sense amplifiers. Details of mats 1 to 4 will be described later.

Read register/write driver 5 inputs/outputs data to/from memory cells included in mat 1. Read register/write driver 6 inputs/outputs data to/from memory cells included in mat 2.

Read register/write driver 7 inputs/outputs data to/from memory cells included in mat 3. Read register/write driver 8 inputs/outputs data to/from memory cells included in mat 4.

Decode circuit 9 selectively activates plural global word lines and plural global bit line pairs included in mats 1 and 2. Decode circuit 10 selectively activates plural global word lines and plural global bit line pairs included in mats 3 and 4. Details of decode circuits 9 and 10 will be described later.

Peripheral circuit 11 controls read register/write drivers 5 to 8 and decode circuits 9 and 10 on the basis of control signals inputted externally to further control operations for inputting/outputting data to/from memory cells included in mats 1 to 4.

Figure 2:
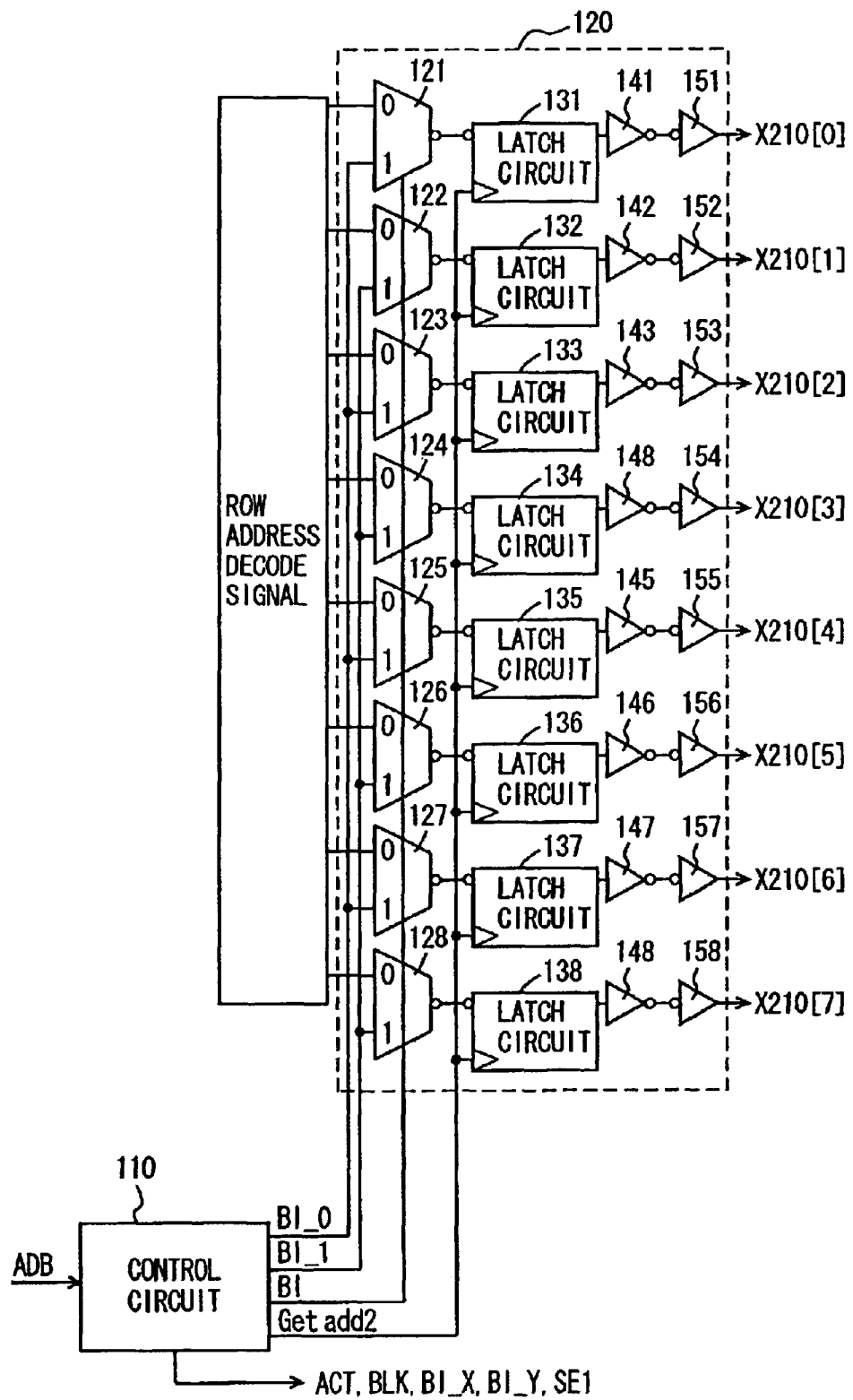
FIG. 2 is a schematic block diagram of a peripheral circuit shown in FIG. 1 and a circuit diagram of a predecoder included in the peripheral circuit.

Referring to FIG. 2, peripheral circuit 11 includes a control circuit 110 and a predecoder 120. Control circuit 110 detects that transition to burn-in test mode is requested when receiving an address ADB constituted of a specific pattern for performing burn-in test. Then, control circuit 110 generates a burn-in test signal BI for causing transition of semiconductor memory device 100 to burn-in test mode, a burn-in test signal BI_0 for selectively activating even-numbered word lines and a burn-in test signal BI_1 for selectively activating odd-numbered word lines on the basis of address ADB to output generated burn-in test signals BI, BI_0 and BI_1 to predecoder 120.

Moreover, control circuit 110 generates a signal Get add2 to output the signal to predecoder 120. Furthermore, control circuit 110 receives externally control signals such as a row address strobe signal /RAS, a column address strobe signal /CAS, a write enable signal /WE and an output enable signal /OE to control operations for inputting/outputting data to/from memory cells.

Still moreover, control circuit 110 generates signals ACT, BLK, BI_X, BI_Y and a sense amplifier activation signal SE1 to output signal ACT to a select circuit and a gate circuit, described later, output signal BLK to a select circuit and an activation circuit, output sense amplifier activation signal SE1 to an activation circuit, output signal BI_X to a gate circuit and a global row decoder, described later, and output signal BI_Y to a global Y decoder, described later.

Note that signal ACT is constituted of an external clock CLK in ordinary operation mode, while, in burn-in test mode, being constituted of a signal having a longer period at H (logical high) level as compared with that in ordinary operation mode. For example, in ordinary operation mode, signal ACT is constituted of external clock CLK having a cycle of 4 nsec and a period at H level thereof is on the order of nsec, while in burn-in test, signal ACT is constituted of external clock CLK having a cycle of 1 $\mu$sec and a period at H level is 0.8 $\mu$sec. The reason why in burn-in test mode, external clock CLK having a longer period at H level is used in such a way is that plural stresses, described later, can be applied to semiconductor memory device 100 with certainty. Signal BLK is a signal for individually selecting each of plural blocks included in mats 1 to 4.

Predecoder 120 includes select circuits 121 to 128, latch circuits 131 to 138, and inverters 141 to 148, and 151 to 158.

Latch circuits 131 to 138 are connected to respective selector circuits 121 to 128. Inverters 141 to 148 are connected to respective latch circuits 131 to 138. Inverters 151 to 158 are connected to respective inverters 141 to 148.

Select circuits 121, 123, 125 and 127 receive a decoded row address decode signal and burn-in test signals BI and BI_0 from control circuit 110. Select circuits 121, 123, 125 and 127 select the row address decode signal when burn-in test signal BI is at L (logical low) level to output the selected row address decode signal to respective corresponding latch circuits 131, 133, 135 and 137, while selecting burn-in test signal BI_0 when burn-in test signal BI is at H level to output selected burn-in test signal BI_0 to respective corresponding latch circuits 131, 133, 135 and 137.

Select circuits 122, 124, 126 and 128 receive a decoded row address decode signal and burn-in test signals BI and BI_1 from control circuit 110. Select circuits 122, 124, 126 and 128 select the row address decode signal when burn-in test signal BI is at L level to output the selected row address decode signal to respective corresponding latch circuits 132, 134, 136 and 138, while selecting burn-in test signal BI_1 when burn-in test signal BI is at H level to output selected burn-in test signal BI_1 to respective corresponding latch circuits 132, 134, 136 and 138.

Latch circuits 131 to 138 receive signal Get add2 from control circuit 110 to capture signals from respective selector circuits 121 to 128 by signal Get add2. Furthermore, latch circuits 131 to 138 latch the captured signals to output the signals to respective inverters 141 to 148. Inverters 141 to 148 invert the signals received from latch circuits 131 to 138 to output the inverted signals to inverters 151 to 158. Inverters 151 to 158 invert the signals received from inverters 141 to 148 to output signals X210[0] to X210[7] to select circuits described later.

When even-numbered word lines included in mats 1 to 4 are selected, control circuit 110 generates burn-in test signals BI and BI_0 at H level and burn-in test signal BI_1 at L level to output burn-in test signals BI and BI_0 at H level thus generated to select circuits 121, 123, 125 and 127 of predecoder 120 and output burn-in test signal BI at H level and burn-in test signal BI_1 at L level to select circuits 122, 124, 126 and 128 of predecoder 120.

Then, select circuits 121, 123, 125 and 127 select burn-in test signal BI_0 at H level in response to burn-in test signal BI at H level to output burn-in test signal BI_0 to respective latch circuits 131, 133, 135 and 137. On the other hand, select circuits 132, 134, 136 and 138 select burn-in test signal BI_1 at L level in response to burn-in test signal BI at H level to output burn-in test signal BI_1 to respective latch circuits 132, 134, 136 and 138.

Latch circuits 131, 133, 135 and 137 latch burn-in test signal BI_0 at H level from respective select circuits 121, 123, 125 and 127 to output burn-in test signal BI_0 at H level thus latched to respective inverters 141, 143, 145 and 147. On the other hand, latch circuits 132, 134, 136 and 138 latch burn-in test signal BI_1 at L level from respective select circuits 122, 124, 126 and 128 to output burn-in test signal BI_1 at L level thus latched to respective inverters 142, 144, 146 and 148.

Inverters 141, 143, 145 and 147 invert burn-in test signal BI_0 at H level from respective latch circuits 131, 133, 135 and 137 to output burn-in test signal BI_0 at L level to respective inverters 151, 153, 155 and 157. On the other hand, inverters 142, 144, 146 and 148 invert burn-in test signal BI_1 at L level from respective latch circuits 132, 134, 136 and 138 to output burn-in test signal BI_1 at H level to respective inverters 152, 154, 156 and 158.

Inverters 151, 153, 155 and 157 invert burn-in test signal BI_0 at L level from respective inverters 141, 143, 145 and 147 to output signals X210[0], X210[2], X210[4] and X210[6] at H level to select circuits described later. On the other hand, inverters 152, 154, 156 and 158 inverts burn-in test signal BI_1 at H level from respective inverters 142, 144, 146 and 148 to output signals X210[1], X210[3], X210[5] and X210[7] at L level to select circuits described later.

When odd-numbered word lines included in mats 1 to 4 are selected, control circuit 110 generates burn-in test signal BI_0 at L level and burn-in test signals BI and BI_1 at H level to output burn-in test signals BI at H level and BI_0 at L level thus generated to select circuits 121, 123, 125 and 127 of predecoder 120 and output burn-in test signals BI and BI_1 at H level to select circuits 122, 124, 126 and 128 of predecoder 120.

Then, select circuits 121, 123, 125 and 127 select burn-in test signal BI_0 at L level in response to burn-in test signal BI at H level to output burn-in test signal BI_0 to respective latch circuits 131, 133, 135 and 137. On the other hand, select circuits 132, 134, 136 and 138 select burn-in test signal BI_1 at H level in response to burn-in test signal BI at H level to output burn-in test signal BI_1 to respective latch circuits 132, 134, 136 and 138.

Latch circuits 131, 133, 135 and 137 latch burn-in test signal BI_0 at L level from respective select circuits 121, 123, 125 and 127 to output burn-in test signal BI_0 at H level thus latched to respective inverters 141, 143, 145 and 147. On the other hand, latch circuits 132, 134, 136 and 138 latch burn-in test signal BI_1 at H level from respective select circuits 122, 124, 126 and 128 to output burn-in test signal BI_1 at H level thus latched to respective inverters 142, 144, 146 and 148.

Inverters 141, 143, 145 and 147 invert burn-in test signal BI_0 at L level from respective latch circuits 131, 133, 135 and 137 to output burn-in test signal BI_0 at H level to respective inverters 151, 153, 155 and 157. On the other hand, inverters 142, 144, 146 and 148 invert burn-in test signal BI_1 at H level from respective latch circuits 132, 134, 136 and 138 to output burn-in test signal BI_1 at L level to respective inverters 152, 154, 156 and 158.

Inverters 151, 153, 155 and 157 inverts burn-in test signal BI_0 at H level from respective inverters 141, 143, 145 and 147 to output signals X210[0], X210[2], X210[4] and X210[6] at L level to select circuits described later. On the other hand, inverters 152, 154, 156 and 158 inverts burn-in test signal BI_1 at L level from respective inverters 142, 144, 146 and 148 to output signals X210[1], X210[3], X210[5] and X210[7] at H level to select circuits described later.

Note that signals X210[0], X210[2], X210[4] and X210[6] at H level are select signals for selecting even-numbered word lines and signals X210[1], X210[3], X210[5] and X210[7] at H level are select signals for selecting odd-numbered word lines.

Since in ordinary operation mode, control circuit 110 generates burn-in test signals BI, BI_0 and BI_1 to output burn-in test signals BI, BI_0 and BI_1 thus generated to predecoder 120, select circuits 121 to 128 select a row address decode signal in response to burn-in test signal BI at L level. Thereafter, the above described operations are performed in latch circuits 131 to 138 and inverters 141 to 148 and 151 to 158 and predecoder 120 outputs signals X210[0] to X210[7] some of which are at H level, but the others of which are at L level to select circuits described later in response to row address decode signal.

Figure 3:
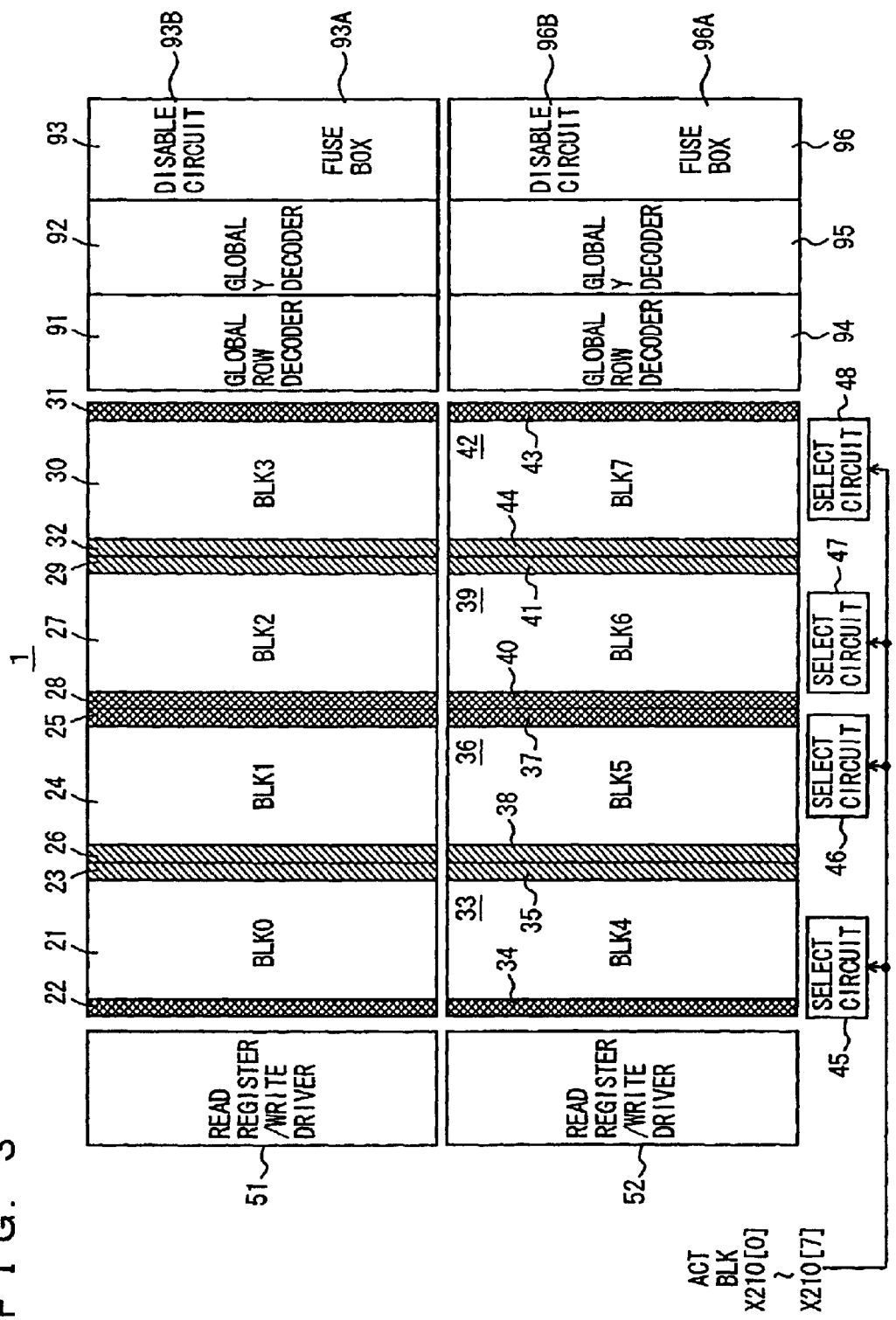
FIG. 3 is a schematic block diagram of a mat shown in FIG. 1.

FIG. 3 is a schematic block diagram showing arrangement of read register/write driver 5, mat 1 and decode circuit 9.

Referring to FIG. 3, mat 1 includes blocks 21, 24, 27, 30, 33, 36, 39 and 42, gate circuit groups 22, 25, 28, 31, 34, 37, 40 and 43, input/output peripheral circuits 23, 26, 29, 32, 35, 38, 41 and 44, and select circuits 45 to 48.

Each of blocks 21, 24, 27, 30, 33, 36, 39 and 42 includes plural memory cells arranged in a matrix, plural word lines extending in row direction, and plural bit line pairs extending in column direction.

Gate circuit groups 22, 25, 28, 31, 34, 37, 40 and 43 selectively connect plural word lines and respective plural global word lines included in corresponding one of blocks 21, 24, 27, 30, 33, 36, 39 and 42.

In this case, gate circuit groups 22 and 34 selectively connect plural word lines in respective blocks 21 and 33 to plural global word lines therein in response to a select signal from select circuit 45. Gate circuit groups 25 and 37 selectively connect plural word lines in respective blocks 24 and 36 to plural global word lines therein in response to a select signal from select circuit 46. Gate circuit groups 28 and 40 selectively connect plural word lines in respective blocks 27 and 39 to plural global word lines therein in response to a select signal from select circuit 47. Gate circuit groups 31 and 43 selectively connect plural word lines in respective blocks 30 and 42 to plural global word lines therein in response to a select signal from select circuit 48. Description will be given of a detailed connection method between the word lines and the global word lines later.

Input/output peripheral circuits 23, 26, 29, 32, 35, 38, 41 and 44 perform inputting/outputting data to/from plural memory cells included in respective blocks 21, 24, 27, 30, 33, 36, 39 and 42.

Each of select circuits 45 to 48 receives signals ACT and BLK from control circuit 110 included in peripheral circuit 11 and receives signals X210[0] to X210[7] from predecoder 120. Then, select circuits 45 to 48 generate select signals for selecting plural word lines included in respective blocks 21, 24, 27, 30, 33, 36, 39 and 42 on the basis of signals ACT, BLK and X210[0] to X210[7]. Select circuit 45 outputs a generated select signal to gate circuit groups 22 and 34, select circuit 46 outputs a generated select signal to gate circuit groups 28 and 40, select circuit 47 outputs a generated select signal to gate circuit groups 28 and 40 and select circuit 48 outputs a generated select signal to gate circuit groups 31 and 43.

Read register/write driver 5 is constituted of read register/write driver 51 and read register/write driver 52. Read register/write driver 51 performs supplying/receiving data with input/output peripheral circuits 23, 26, 29 and 32. Read register/write driver 52 performs supplying/receiving data with input/output peripheral circuits 35, 38, 41 and 44.

Decode circuit 9 includes global row decoders 91 and 94, global Y decoders 92 and 95, and fuse box/disable circuits 93 and 96.

Global row decoders 91 and 94 individually selects plural global word lines on the basis of a decoded row address decode signal. Global row decoders 91 and 94 each select a spare global word line instead of a regular global word line when receiving a signal for selecting the spare global word line from respective fuse box/disable circuits 93 and 96.

Global Y decoders 92 and 95 individually select plural global bit line pairs on the basis of a decoded column address decode signal. Global Y decoders 92 and 95 each select a spare global word line instead of a regular global word line when receiving a signal for selecting the spare global word line from respective fuse box/disable circuits 93 and 96.

Fuse box/disable circuit 93 includes, a fuse box 93A, and a disable circuit 93B. Fuse box 93A stores a row address for designating a global word line or a global bit line pair connected to a defective memory cell. Disable circuit 93B, when receiving a decoded row address decode signal, determines whether or not a row address according to the row address decode signal the circuit has received coincides with a row address stored in fuse box 93A; and if in coincidence, causes a global word line designated by an inputted row address to be in non-selected state and outputs a signal for selecting a spare global word line substituting for the global word line in non-selected state to global row decoder 91.

Disable circuit 93B, in a case where receiving a decoded column address decode signal, also performs a similar operation to the case where receiving a decoded row address decode signal. Disable circuit 93B, when selecting a spare global bit line pair, generates a signal for selecting a spare global bit line pair to output the signal to global Y decoder 92.

Fuse box/disable circuit 96 includes a fuse box 96A, and a disable circuit 96B. Fuse box 96A works in the same way as fuse box 93A. Disable circuit 96B works in the same way as disable circuit 93B.

Global row decoder 91, global Y decoder 92 and fuse box/disable circuit 93 select plural global word lines connected to plural word lines and plural global bit line pairs connected to plural bit line pairs, included blocks 21, 24, 27 and 30 according to a row address or a column address, while global row decoder 94, global Y decoder 95 and fuse box/disable circuit 96 select plural global word lines connected to plural word lines and plural global bit line pairs connected to plural bit line pairs, included blocks 33, 36, 39 and 42 according to a row address or a column address.

Mats 2 to 4 each have the same configuration as mat 1. Read register/write drivers 6 to 8 each have the same configuration as read register/write driver 5. Decode circuit 10 has the same configuration as decode circuit 9.

Therefore, description will be given of inputting/outputting data to/from mat 1 and a burn-in test below.

Figure 4:
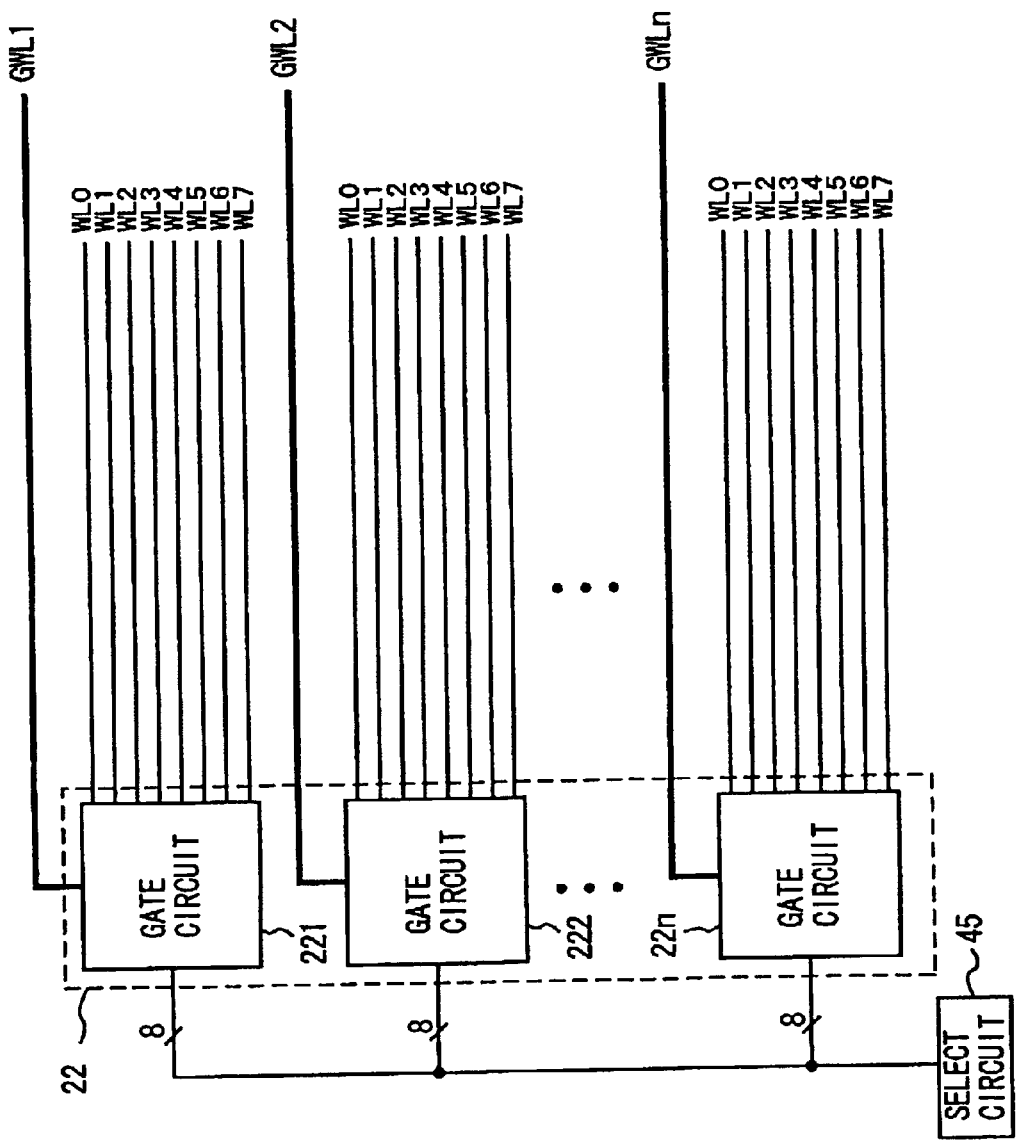
FIG. 4 is a diagram for describing a select method of each word line.

FIG. 4 is a diagram for describing a state of connection between plural global word lines and plural word lines. Note that FIG. 4 describes block circuit 21, gate circuit group 22 and select circuit 45. Referring to FIG. 4, gate circuit group 22 includes gate circuits 22*l* to 22*n* (n is a natural number). Each of gate circuits 221 to 22*n*, in ordinary operation mode, connects one global word line GWL (representing one of GWL1 to GWLn) to one of 8 word line WL0 to WL7 according to a select signal from select circuit 45. Each of gate circuits 221 to 21*n*, in burn-in test mode, connects one global word line GWL (representing one of GWL1 to GWLn) simultaneously to even-numbered word lines WL0, WL2, WL4 and WL6 or odd-numbered word lines WL1, WL3, WL5 and WL7 of 8 word line WL0 to WL7 according to a select signal from select circuit 45. Note that each of global word lines GWL1 to GWLn is selected by global row decoder 91.

In such a way, by individually selecting global word lines GWL1 to GWLn to connect word lines WL0 to WL7 to one of global word lines GWL1 and GWLn, plural word lines provided in block 21 are selected.

In a case where n=256, for example, gate circuit group 22 includes 256 gate circuits. Each of 256 gate circuits is provided correspondingly to 8 word lines WL0 to WL7, therefore one block includes 256×8=2048 word lines.

Figure 5:
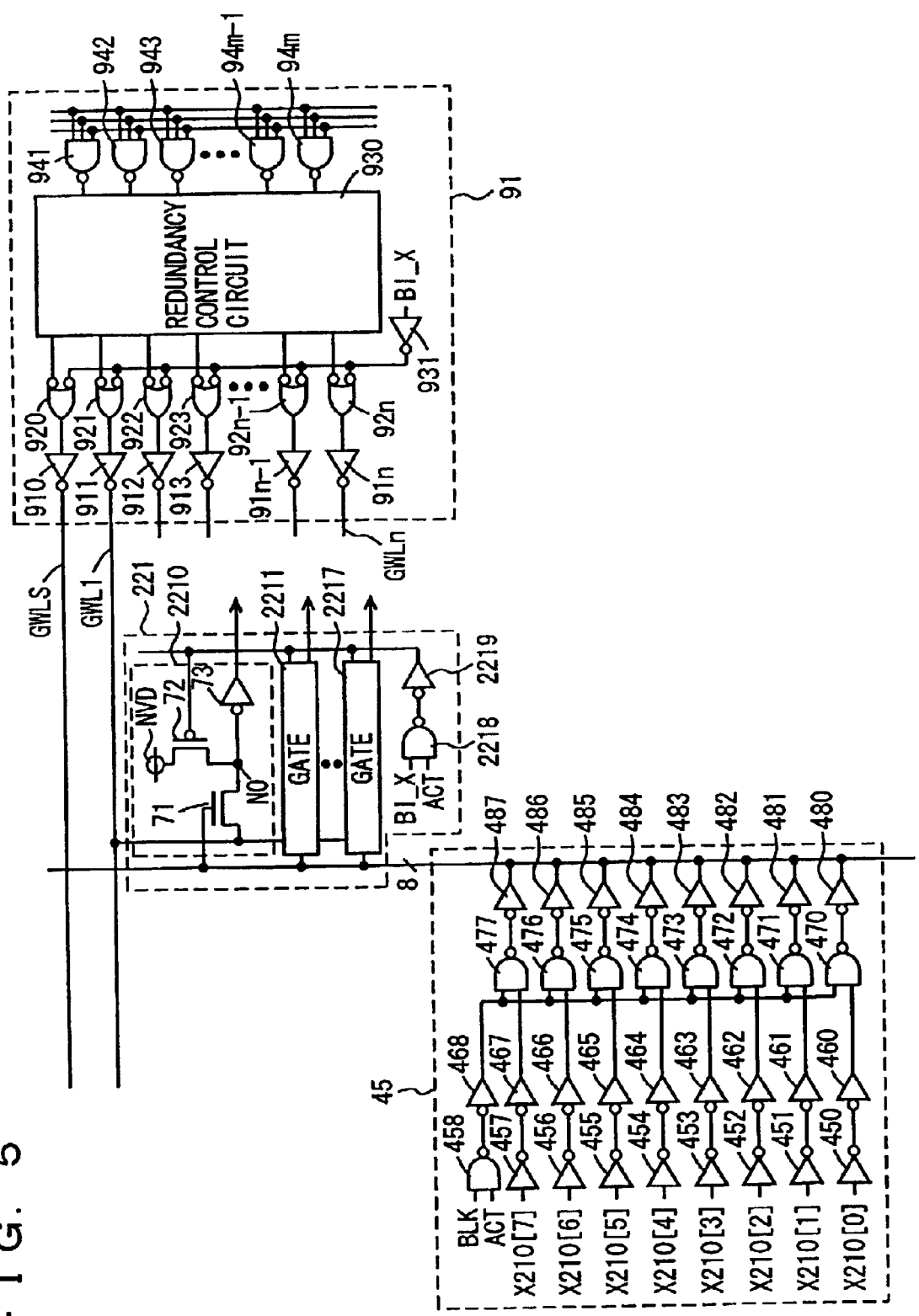
FIG. 5 is a circuit diagram of a select circuit, a gate circuit and a global row decoder.

FIG. 5 is a diagram for describing detailed functions of select circuit 45, gate circuit 221 included in gate circuit group 22 and global row decoder 91. Referring to FIG. 5, select circuit 45 includes inverters 450 to 457, 460 to 468 and 480 to 487, and NAND gates 458 and 470 to 477.

Inverters 450 to 457 receive respective signals X210[0] to X210[7] from predecoder 120 to invert the received signal X210[0] to X210[7]. Inverters 460 to 467 receive signals outputted from respective inverters 450 to 457 to invert the received signals.

NAND gate 458 performs a logical product operation on signals BLK and ACT from control circuit 110 to invert a result of the operation. Inverter 468 inverts a signal outputted from NAND gate 458.

NAND gates 470 to 477 receive output signals of respective inverters 460 to 467 at the other terminals, while receiving an output signal of inverter 468 at one terminals. Each of NAND gates 470 to 477 performs a logical product operation on two received signal to invert a result of the operation and to output. Inverters 480 to 487 invert output signals from NAND gates 470 to 477 to output.

When block 21 is activated, signal BLK is at H level, so NAND gate circuit 458 outputs a signal at L level during a period when signal ACT is at H level. Then, inverter 468 inverts a signal at L level from NAND gate 458 to output a signal at H level to one terminals of NAND gates 470 to 477.

Then, NAND gates 470 to 477 output signals outputted from inverters 460 to 467, that is signals corresponding to logical levels of signals X210[0] to X210[7]. As a result, select circuit 45 outputs signals corresponding to logical levels of signals X210[0] to X210[7] to gate circuit 221.

For example, when select circuit 45 receives signal X210[0] at H level and signals X210[1] to X210[7] at L level from predecoder 120, inverter 450 inverts signal X210[0] at H level to output X210[0] at L level and inverters 451 to 457 invert respective signals X210[1] to X210[7] to output signals X210[1] to X210[7] at H level.

By doing so, inverter 460 inverts signal X210[0] at L level to output X210[0] at H level, and inverters 461 to 467 invert respective signals X210[1] to X210[7] to output signals X210[1] to X210[7] at L level.

NAND gate 470 performs a logical product operation on signal X210[0] at H level from inverter 460 and a signal at H level from inverter 468 to invert a result of the operation and to output a signal at L level. Each of NAND gates 471 to 477 performs a logical product operation on corresponding one of signal X210[1] to X210[7] from inverters 461 to 467 and a signal at H level from inverter 468 to invert a result of the operation and to output a signal at H level.

Inverter 480 inverts a signal at L level from NAND gate 470 to output a signal at H level and inverters 481 to 487 invert signals at H level from respective NAND gates 471 to 477 to output signals at L level.

Therefore, select circuit 45 outputs signals corresponding to logical levels of signals X210[0] to X210[7] received from predecoder 120.

Select circuits 46 to 48 each have the same configuration as select circuit 45.

Gate circuit 221 includes gates 2210 to 2217, NAND gate 2218, and an inverter 2219.

Gates 2210 to 2217 receives signals from respective inverters 480 to 487 of select circuit 45. While one signal line is shown from select circuit 45 to gate circuit 221 in FIG. 5, in actuality, 8 signal lines are provided.

Gate 2210 is constructed of an N-channel MOS transistor 71, a P-channel MOS transistor 72, and an inverter 73. N-channel MOS transistor 71 is connected between global word line GWL1 and a node N0 and receives an output signal from inverter 480 of select circuit 45 at the gate terminal thereof. P-channel MOS transistor 72 is connected between power supply node NVD and node N0 and receives an output signal from inverter 2219 at the gate terminal thereof Inverter 73 inverts a signal on node N0 to activate/deactivate (selection/non-selection) word line WL0 (see FIG. 4).

When word line WL0 is activated, inverter 480 of select circuit 45 outputs a signal at H level to gate 2210 and NAND gate 2218 of gate circuit 221 receives signal BI_X at H level from control circuit 110.

Then, NAND circuit 2218 outputs a signal at L level during a period when signal ACT is at H level and inverter 2219 inverts the signal at L level to output a signal at H level. P-channel MOS transistor 72 of gate circuit 2210 is tuned off by the signal at H level from inverter 2219. N-channel MOS transistor 71 is turned on by a signal at H level from inverter 480 of select circuit 45 and node N0 assumes the same level as global word line GWL1 at L level (global word line GWL1 is activated at L level). Then, inverter 73 inverts a signal at L level to output a signal at H level and to activate word line WL0. Accordingly, activation of word line WL0 on the basis of activated global word line GWL1 corresponds to connection of GWL1 to word line WL0.

Gates 2211 to 2217 each has the same configuration of gate 2210 and connect global word line GWL1 to word lines WL1 to word line WL7 (see FIG. 4).

On the other hand, when receiving a signal BI_X at L level from control circuit 110, NAND gate 2218 outputs a signal at H level with no respect to a logical level of signal ACT and inverter 2219 outputs a signal at L level. Therefore, P-channel MOS transistor 72 is tuned on to supply power supply voltage from power supply node NVD to node N0 and drive node N0 to H level. Then, inverter 73 outputs a signal at L level to deactivate word line WL0. In this case, inverter 73 outputs a signal at L level to deactivate word line WL0 (or word lines WL1 to WL7) regardless of whether global word line GWL1 is activated to L level or deactivated to H level.

Control circuit 110, therefore, outputs signal BI_X at H level to gate circuit 221 when gate circuit 221 activates word lines WL0 to WL7.

Gate circuits 222 to 22n each have the same configuration as gate circuit 221 and connect global word lines GWL2 to GWLn to respective corresponding word lines WL0 to WL7.

Global row decoder 91 includes inverters 910 to 91n and 931, NOR gates 920 to 92n, a redundancy control circuit 930, and NAND gates 941 to 94m (m is a natural number).

Inverters 910 to 91n are provided correspondingly to NOR gates 920 to 92n. NOR gates 920 to 92n receives the inverted signals of output signals of redundancy control circuit 930 at respective one terminals thereof and the inverted signal of an output signal of inverter 931 at the respective other terminals. NOR gates 920 to 92n each perform a logical sum operation on the two received signals to output a result of the operation to corresponding one of inverters 910 to 91n.

Redundancy control circuit 930 performs control to select a spar global word line GWLS instead of global word lines GWL1 to GWLn. Inverter 931 inverts signal BI_X from control circuit 110 to output the inverted signal to the other terminals of NOR gates 920 to 92n. NAND gates 941 to 94m decode a row address to output the decoded row address to redundancy control circuit 930.

In ordinary operation mode of semiconductor memory device 100, control circuit 110 outputs signal BI_X at L level to global row decoder 91. Then, inverter 931 inverts signal BI_X at L level to output the signal at H level to the other terminals of NOR gates 920 to 92n. On the other hand, NAND gates 941 to 94m decode a row address to output the decoded row address to redundancy control circuit 930. When receiving a control signal for selecting a spare global word line GWLS instead of a global word line (one of global word lines GWL1 to GWLn) designated by a row address that the redundancy control circuit 930 has received from NAND gates 941 to 94m, from disable circuit 93B of fuse box/disable circuit 93, redundancy control circuit 930 outputs a signal at L level to NOR gate 920 and outputs signals at H level to NOR gates 921 to 92n.

By doing so, NOR gate 920 performs a logical sum operation on the signal at H level obtained by inverting a signal at L level outputted from redundancy control circuit 30 and the signal at L level obtained by inverting a signal at H level outputted from inverter 931 to output a signal at H level to inverter 910. Then, inverter 910 inverts the signal at H level to output a signal at L level and to activate spare global word line GWLS. NOR gates 921 to 92n each perform a logical sum operation on the signal at L level obtained by inverting a signal at H level outputted from redundancy control circuit 930 and the signal at L level obtained by inverting a signal at H level outputted from inverter 931 to output signals at L level to respective inverters 911 to 91n. Inverters 911 to 9n each invert the signal at L level to output a signal at H level and to deactivate global word lines GW1 to GWLn.

When receiving no control signal for selecting spare global word line GWLS from disable circuit 93B, redundancy control circuit 930 outputs a signal at H level to NOR gate 920 and outputs a row address from NAND gates 941 to 94m to NOR gates 921 to 92n. NOR gate 920 performs a logical sum operation on the signal at L level obtained by inverting a signal at H level outputted from redundancy control circuit 930 and the signal at L level obtained by inverting a signal at H level outputted from inverter 931 to output a signal at L level to inverter 910. Inverter 910 inverts the signal at L level to output a signal at H level and to deactivate spare global word line GWLS.

NOR gate 921 to 92n output signals on the basis of row address from redundancy control circuit 930 to inverters 911 to 91n and inverters 911 to 91n activate a global word line (one of global word lines GWL1 to GWLn) designated by a row address.

In burn-in test mode of semiconductor memory device 100, control circuit 110 outputs signal BI_X at H level to global row decoder 91. Then, inverter 931 inverts signal BI_X at H level to output the signal at L level to the other terminals of NOR gate 920 to 92n.

Since NOR gates 920 to 92n receive the signals at H level obtained by inverting a signal at L level outputted from inverter 931 at the other terminals, NOR gates 920 to 92n output signals at H level to respective inverters 910 to 91n with no respect to a logical level of signals from redundancy control circuit 930. As a result, inverters 910 to 91n invert the signals at H level to output signals at L level and to activate global word lines GWLS and GWL1 to GWLn.

In burn-in test mode, in such a way, global row decoder 91 activate all of global word lines GWLS and GWL1 to GWLn.

Description will be given of operations in select circuit 45, gate circuit 221 and global row decoder 91 in selection of each of word lines WL0 to WL7.

When word line WL0, for example, is selected, predecoder 120 outputs signal X210[0] at H level and signal X210[1] to X210[7] at L level to select circuit 45, and control circuit 110 outputs signal ACT and signal BLK at H level to select circuit 45, outputs signal BI_X at H level to gate circuit 221 and outputs signal BI_X at L level to global row decoder 91.

Select circuit 45, according to the above operation, outputs a signal at H level to gate 2210 of gate circuit 221 with inverter 480 and further outputs signals at L level to respective gates 2211 to 2217 of gate circuit 221 with inverters 481 to 487.

On the other hand, NAND gates 941 to 94m decode row address ADD1 for designating global word line GWL1 to output the decoded address to redundancy control circuit 930. In this case, since redundancy control circuit 930 receives no control signal for selecting spare global word line GWLS from disable circuit 93B, redundancy control circuit 930 outputs decoded row address ADD1 to NOR gates 920 to 92n.

Inverter 931 inverts signal BI_X at L level to output the signal at H level to NOR gates 920 to 92n. NOR gates 920 to 92n, following the above described operation, outputs signals for selecting global word line GWL1. That is, NOR gates 920 and 922 to 92n output signals at L level and NOR gate 921 outputs a signal at H level. Then, inverters 910 and 912 to 91n inverts the signals at L level to output signals at H level to cause global word lines GWLS and GWL2 to GWLn to be in non-selected state. Inverter 911 inverts the signal at H level to output a signal at L level to select global word line GWL1.

In gate circuit 221, gate 2210 receives a signal at H level from inverter 480 of select circuit 45, while gates 2211 to 2217 receive signals at L level from inverters 481 to 487 of select circuit 45. In gate 2210, since N-channel MOS transistor 71 is turned on, while P-channel MOS transistor 72 is turned off, N-channel MOS transistor 71 supplies a potential at L level on global word line GWL1 to node N0 and node N0 receives a signal at L level. Then, inverter 73 inverts the signal at L level to output a signal at H level to activate (or select) word line WL0.

In gates 2211 to 2217, since N-channel MOS transistor 71 is turned off, word lines WL1 to WL7 are deactivated (or caused to be in non-selected state).

The other word lines WL1 to WL7 are activated following the above described operation. Operation in which gate circuits 222 to 22n connect each of global word lines GWL2 to GWLn to word lines WL0 to WL7 is the same as the above described operation.

In burn-in test mode, as described later, even-numbered word lines or odd-numbered word lines are simultaneously selected. Therefore, control circuit 110 outputs signal ACT and signal BI_X at H level to gate circuit 221, outputs signal BI_X at H level to global row decoder 91 and outputs signal ACT and signal BLK at H level to select circuit 45.

When even-numbered word lines are selected, predecoder 120, as described above, outputs signals X210[0], X210[2], X210[4] or X210[6] at H level and signals X210[1], X210[3], X210[5] or X210[7] at L level.

With such outputting of signals, select circuit 45 outputs signals at H levels to gates 2210, 2212, 2214 and 2216 of gate circuit 221 with inverters 480, 482, 484, 486 and further outputs signals at L level to gates 2211, 2213, 2215 and 2217 of gate circuit 221 with inverters 481, 483, 485 and 487.

On the other hand, global row decoder 91, when receiving signal BI_X at H level, selects all of global word lines GWLS and GWL1 to GWLn as described above.

In gate circuit 221, gates 2210, 2212, 2214 and 2216 connect global word line GWL1 to word lines WL0, WL2, WL4 and WL6, while gates 2211, 2213, 2215 and 2217 do not connect global word line GWL1 to word lines WL1, WL3, WL5 and WL7. As a result, word lines WL0, WL2, WL4 and WL6 are activated, while word lines WL1, WL3, WL5 and WL7 are deactivated.

Gate circuits 222 to 22n, according to the same operation as in gate circuit 221, activate word lines WL0, WL2, WL4 and WL6 of corresponding word lines WL0 to WL7, while deactivating word lines WL1, WL3, WL5 and WL7 thereof.

With such operation, even-numbered global word lines in block 21 (see FIG. 3) controlled by select circuit 45 and global row decoder 91 are simultaneously selected.

Next, when odd-numbered word lines are selected, predecoder 120, as described above, outputs signals X210[0], X210[2], X210[4] and X210[6] at L level and signals X210[1], X210[3], X210[5] and X210[7] at H level.

With such outputs of signals, select circuit 45 outputs signals at L level to gates 2210, 2212, 2214 and 2216 of gate circuit 221 with inverters 480, 482, 484, 486 and further outputs signals at H level to gates 2211, 2213, 2215 and 2217 of gate circuit 221 with inverters 481, 483, 485 and 487.

On the other hand, global row decoder 91, as in the case where even-numbered word lines are selected, selects all of global word lines GWLS and GWL1 to GWLn.

In gate circuit 221, gates 2210, 2212, 2214 and 2216 do not connect global word line GWL1 to respective word lines WL0, WL2, WL4 and WL6, while gates 2211, 2213, 2215 and 2217 connect global word line GWL1 to respective word lines WL1, WL3, WL5 and WL7. As a result, word lines WL0, WL2, WL4 and WL6 are deactivated, while word lines WL1, WL3, WL5 and WL7 are activated.

Gate circuits 222 to 22n, according to the same operation as in gate circuit 221, deactivate word lines WL0, WL2, WL4 and WL6 of corresponding word lines WL0 to WL7, while activating word lines WL1, WL3, WL5 and WL7 thereof With such operation, odd-numbered global word lines in block 21 (see FIG. 3) controlled by select circuit 45 and global row decoder 91 are simultaneously selected.

In such a way, in burn-in test mode of semiconductor memory device 100, even-numbered word lines are simultaneously selected by signals X210[0], X210[2], X210[4] and X210[6] at H level and signals X210[1], X210[3], X210[5] and X210[7] at L level from predecoder 120 while odd-numbered word lines are simultaneously selected by signals X210[0], X210[2], X210[4] and X210[6] at L level and signals X210[1], X210[3], X210[5] and X210[7] at H level from predecoder 120.

Select circuit 45 and global row decoder 94, according to the above described operation, select each of plural word lines in block 33 in ordinary operation mode, while selecting even-numbered word lines or odd-numbered word lines in block 33 simultaneously in burn-in test mode.

Select circuit 46 and global row decoder 91, according to the above described operation, select each of plural word lines in block 24 in ordinary operation mode, while selecting even-numbered word lines or odd-numbered word lines in block 24 simultaneously in burn-in test mode.

Select circuit 46 and global row decoder 94, according to the above described operation, select each of plural word lines in block 36 in ordinary operation mode, while selecting even-numbered word lines or odd-numbered word lines in block 36 simultaneously in burn-in test mode.

Select circuit 47 and global row decoder 91, according to the above described operation, select each of plural word lines in block 27 in ordinary operation mode, while selecting even-numbered word lines or odd-numbered word lines in block 27 simultaneously in burn-in test mode.

Select circuit 47 and global row decoder 94, according to the above described operation, select each of plural word lines in block 39 in ordinary operation mode, while selecting even-numbered word lines or odd-numbered word lines in block 39 simultaneously in burn-in test mode.

Select circuit 48 and global row decoder 91, according to the above described operation, select each of plural word lines in block 30 in ordinary operation mode, while selecting even-numbered word lines or odd-numbered word lines in block 30 simultaneously in burn-in test mode.

Select circuit 48 and global row decoder 94, according to the above described operation, select each of plural word lines in block 42 in ordinary operation mode, while selecting even-numbered word lines or odd-numbered word lines in block 42 simultaneously in burn-in test mode.

Figure 6:
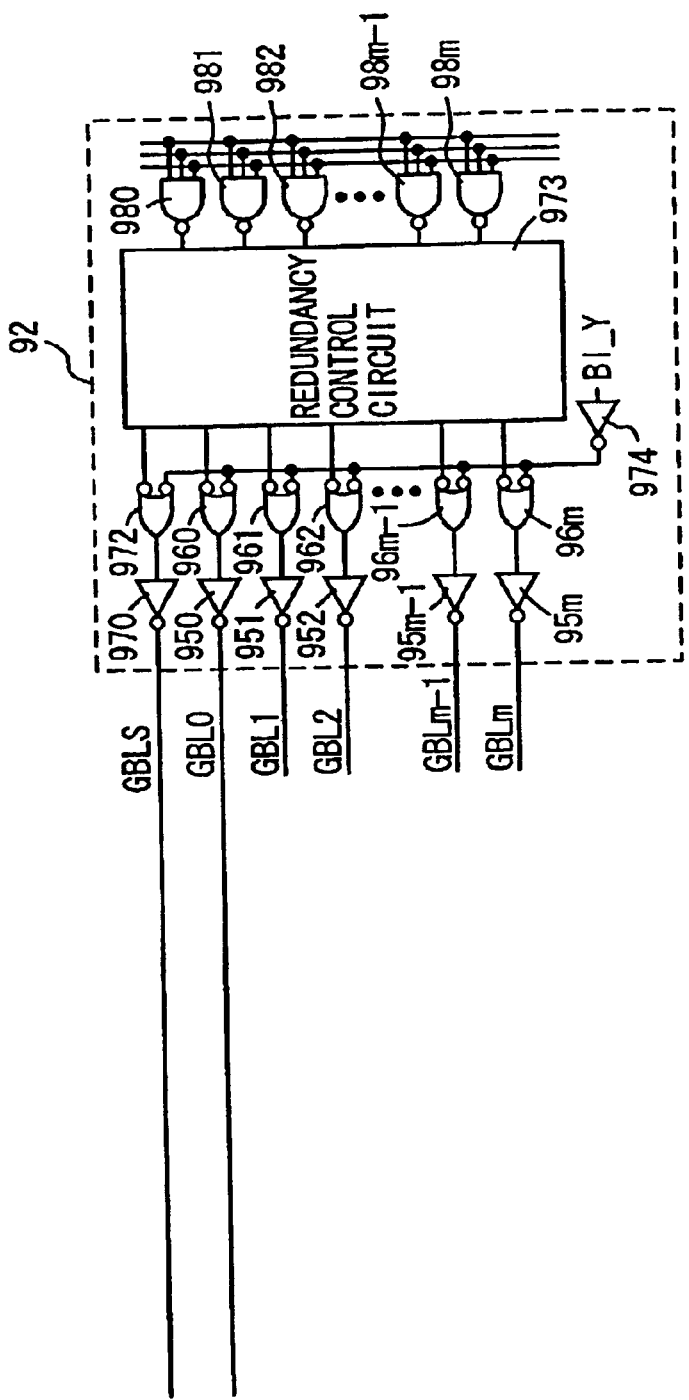
FIG. 6 is a circuit diagram of a global Y decoder.

Referring to FIG. 6, global Y decoder 92 includes inverters 950 to 95m, 970 and 974, NOR gates 960 to 96m and 972, a redundancy control circuit 973, and NAND gates 980 to 98m.

Inverters 950 to 95m and 970 are provided correspondingly to respective NOR gates 960 to 96m and 972. NOR gates 960 to 96m and 972 receive the inverted signal of output signals of redundancy control circuit 973 at one terminals thereof while receiving the inverted signal of an output signal of inverter 974 at the other terminals thereof. NOR gates 960 to 96m and 972 each performs a logical sum operation on two received signals to output a result of the operation to corresponding one of inverters 950 to 95m and 970.

Redundancy control circuit 973 performs to control to select spare global bit line pair GBLS instead of global bit line pairs GBL0 to GBLm. Inverter 974 inverts signal BI_Y from control circuit 110 to output the inverted signal to the other terminals of NOR gates 960 to 96m and 972. NAND gates 980 to 98m decode a column address to output the decoded column address to redundancy control circuit 973.

In ordinary operation mode of semiconductor memory device 100, control circuit 110 outputs signal BI_Y at L level to global Y decoder 92. Inverter 974 inverts signal BI_Y at L level to output a signal at H level to the other terminals of NOR gates 960 to 96m and 972. NAND gates 980 to 98m decode a column address to output the decoded column address to redundancy control circuit 973. When receiving a control signal for selecting spare global bit line pair GBLS instead of a global bit line pair (one of global bit line pairs GBL0 to GBLm) designated by a column address that redundancy control circuit 973 has received from NAND gates 980 to 98m, from disable circuit 93B of fuse box/disable circuit 93, redundancy control circuit 973 outputs a signal at L level to NOR gate 972 and outputs signals at H level to NOR gates 960 to 96m.

With such outputting of signals, NOR gate 972 performs a logical sum operation on the signal at H level obtained by inverting a signal at L level outputted from redundancy control circuit 973 and the signal at L level obtained by inverting a signal at H level outputted from inverter 974 to output a signal at H level to inverter 970. Inverter 970 inverts the signal at H level to output a signal at L level to activate spare global bit line pair GBLS. NOR gates 960 to 96m each perform a logical sum operation on the signal obtained by inverting a signal at H level outputted from redundancy circuit 973 and the signal at H level outputted from inverter 974 to output a signal at L level to corresponding one of inverters 950 to 95m. Inverters 950 to 95m invert the signals at L level to output signals at H level and to deactivate global bit line pairs GBL0 to GBLm.

Redundancy control circuit 973, when receiving no control signal for selecting spare global bit line pair GBLS from disable circuit 93B, outputs a signal at H level to NOR gate 972 and outputs a column address from NAND gates 980 to 98m to NOR gates 960 to 96m. NOR gate 972 performs a logical sum operation on the signal at L level obtained by inverting the signal at H level outputted from redundancy control circuit 973 and the signal at L level obtained by inverting a signal outputted from inverter 974 to output a signal at L level to inverter 970. Inverter 970 inverts the signal at L level to output a signal at H level and to thereby deactivate spare global bit line pair GBLS.

NOR gates 960 to 96m output signals on the basis of a column address from redundancy control circuit 973 to inverters 950 to 95m and inverters 950 to 95m activate a global bit line pair (one of global bit line pairs GBL0 to GBLm) designated by the column address.

In burn-in test mode of semiconductor memory device 100, control circuit 110 outputs signal BI_Y at H level to global Y decoder 92. Then, inverter 974 inverts signal BI_Y at H level to output a signal at L level to the other terminals of NOR gates 960 to 96m and 972.

Since NOR gates 960 to 96m and 972 receive the signal at H level obtained by inverting a signal at L level outputted from inverter 974 at the other terminals thereof, NOR gates 960 to 96m and 972 output signals at H level to inverters 950 to 95m and 970 with no respect to a logical level of signals from redundancy control circuit 973. As a result, inverters 950 to 95m and 970 invert the signals at H level to output signals at L level to activate respective global bit line pairs GBL0 to GBLm and GBLS.

In such a way, global Y decoder 92, in burn-in test mode, activates all of global bit line pairs GBL0 to GBLm and GBLS simultaneously.

Figure 7:
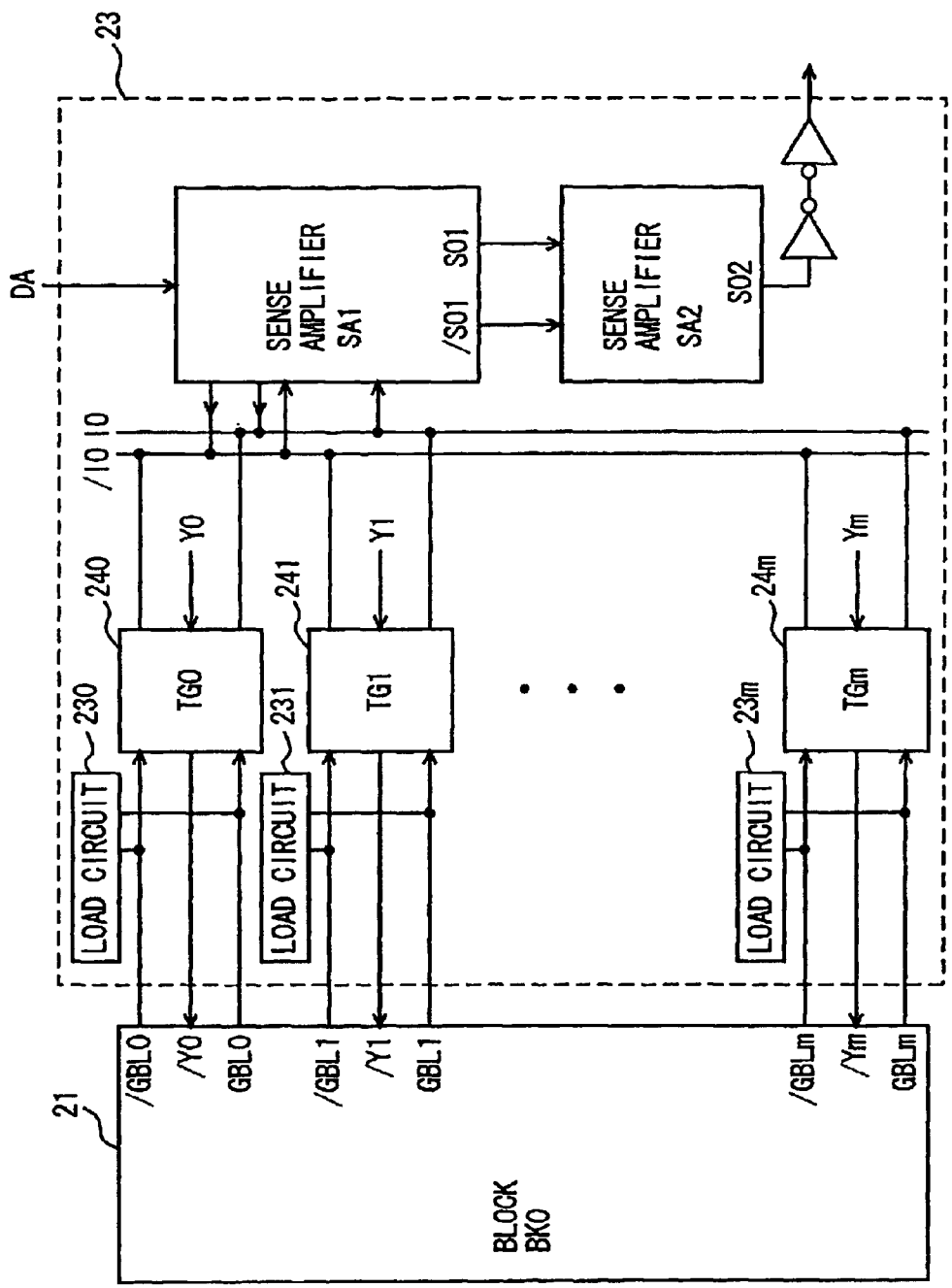
FIG. 7 is a schematic block diagram of an input/output peripheral circuit shown in FIG. 3.

FIG. 7 is a diagram showing block 21 (block BK0) and input/output peripheral circuit 23. Referring to FIG. 7, input/output peripheral circuit 23 includes load circuits 230 to 23m, transfer gates 240 to 24m (hereinafter referred to as Y gates 240 to 24m), and sense amplifiers SA1 and SA2.

Load circuits 230 to 23m are provided correspondingly to respective global bit line pairs GBL0 and /GBL0 to GBLm and /GBLm. Load circuits 230 to 23m are load circuits each functioning as a sense amplifier to amplify read data read out from a memory cell included in BK0. Note that global bit line pairs GBL0 and /GBL0 to GBLm and /GBLm indicate global bit line pairs GBL0 to GBLm shown in FIG. 6.

Y gates 240 to 24m are provided correspondingly to respective global bit line pairs GBL0 and /GBL0 to GBLm and /GBLm and activated by column address Y0 to Ym. Y gates 240 to 24m, when being activated by column address Y0 to Ym, connect global bit line pairs GBL0 and /GBL0 to GBLm and /GBLm to input/output lines IO and /IO in a write operation and a read operation for data. Furthermore, Y gates 240 to 24m invert respective column address Y0 to Ym to output column address /Y0 to /Ym.

Sense amplifier SA1 receives read data on input/output lines IO and /IO to amplify the read data and to output the amplified data to sense amplifier SA2. Furthermore, sense amplifier SA1 outputs write data DA from read register/write driver 51 onto input/output lines IO and /IO.

Sense amplifier SA2 amplifies read data from sense amplifier SA1 to output the amplified data to read register/write driver 51.

Figure 8:
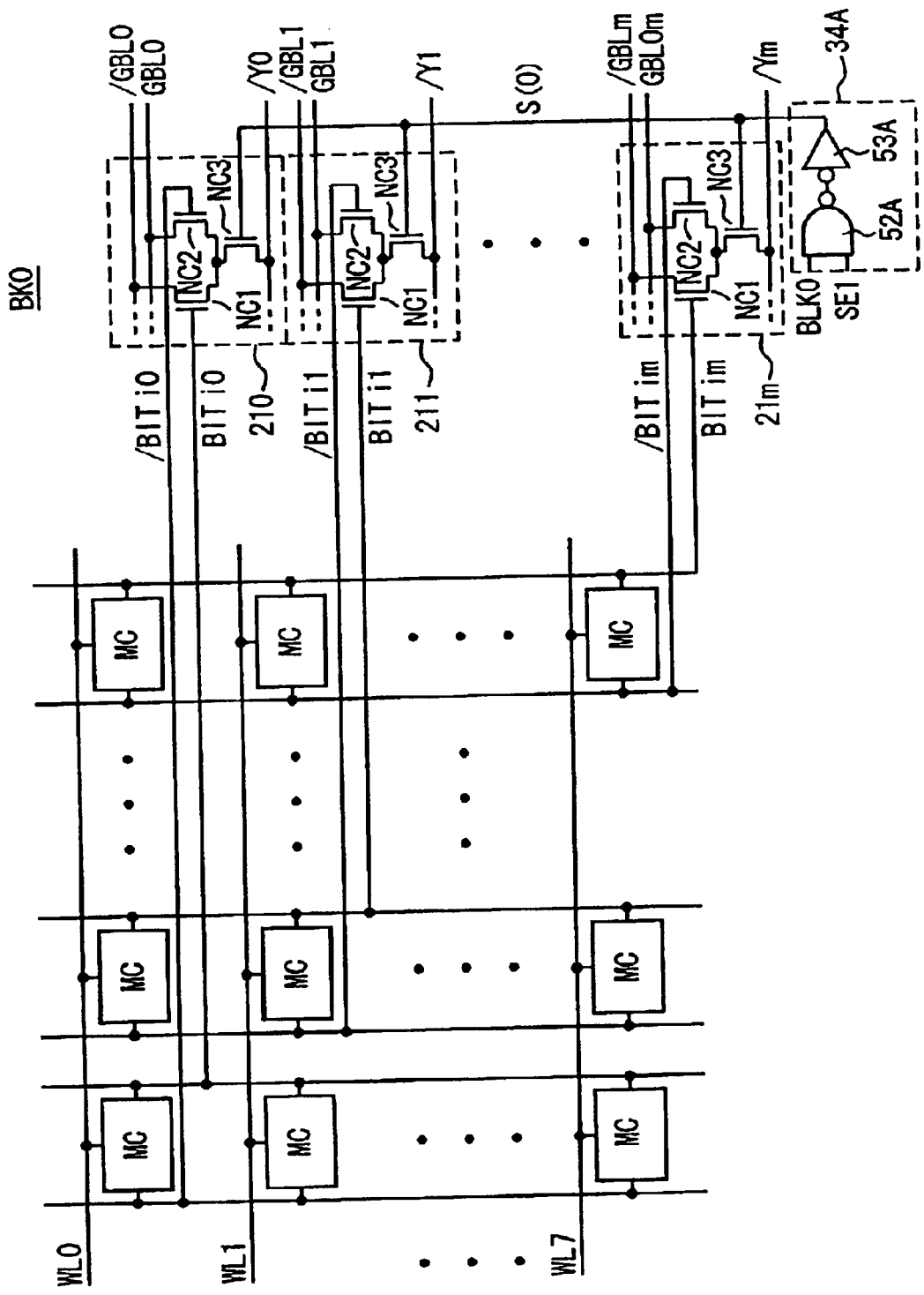
FIG. 8 is a schematic block diagram of a block BK0 shown in FIG. 7.

FIG. 8 is a diagram showing an arrangement in block 21, that is block BK0. Referring to FIG. 8, block BK0 includes plural memory cells arranged in a matrix, plural word lines WL0 to WL7, plural bit line pairs BITi0 and /BITi0 to BITim and /BITim, input/output circuits 210 to 21m, and an activation circuit 34A.

Note that while block BL0 includes word lines more than 8 word lines WL0 to WL7, a configuration is adopted in which each of plural global word lines GWL1 to GWLn, as described above, corresponds with word lines WL0 to WL7, thereby selecting each of plural word lines included in block BK0, therefore in FIG. 8, there is shown word lines WL0 to WL7 corresponding to one global word line (one of global word lines GWL1 to GWLn).

Memory cells MC are disposed correspondingly to intersections between each word line WL and each bit line pair BIT and /BIT.

Bit line pairs BITi0 and /BITi0 to BITim and /BITim correspond to each of global bit line pairs GBL0 and /GBL0 to GBLm, and /GBLm.

Input/output circuits 210 to 21m are provided corresponding to respective bit line pairs BITi0 and /BITi0 to BITim and /BITim. Each of input/output circuit 210 to 21m is constituted of N-channel MOS transistors NC1 to NC3.

N-channel MOS transistor NC3 receives a corresponding column address /Y at one conductive terminal thereof N-channel MOS transistor NC3 enters a conductive state in response to block-specific sense amplifier activation signal S(0) outputted from activation circuit 34A described later.

N-channel MOS transistor NC1 is connected between corresponding global bit line /GBL (one of global bit lines /GBL0 to /GBLm) and the other conductive terminal of N-channel MOS transistor NC3. N-channel MOS transistor NC2 is connected between corresponding global bit line GBL (one of global bit lines GBL0 to GBLm) and the other conductive terminal of N-channel MOS transistor NC3. The gate terminal of N-channel MOS transistor NC1 is connected to corresponding bit line BIT (one of bit line pairs BITi0 to BITim) and the gate terminal of N-channel MOS transistor NC2 is connected to corresponding bit line /BIT (one of bit line pairs /BITi0 to /BITim).

Description will be given of operation in each of input/output circuits 210 to 21m using input/output circuit 210 as an example. N-channel MOS transistor NC3 enters conductive state, when block-specific sense amplifier activation signal S(0) is driven to H level (block BK0 becomes an object for reading). N-channel MOS transistor NC1 enters conductive state in response to a potential on corresponding bit line BITi0 while N-channel MOS transistor NC2 enters conductive state in response to a potential on corresponding bit line /BITi0.

When there arises a small potential difference between bit lines BITi0 and /BITi0 while N-channel MOS transistor NC3 is in conductive state, a difference, in response to this, arises between a potential on corresponding global bit line GBL0 and corresponding potential on global bit line /GBL0. Thereby, the potential difference between bit lines BITi0 and /BITi0 is transmitted to global bit line pair GBL0 and /GBL0 therebetween and thus read data is outputted from bit line pair BITi0 and /BITi0 onto global bit line pair GBL0 and /GBL0.

Activation circuit 34A includes a NAND gate 52A, and an inverter 53A. NAND gate 52A receives signal BLK0 for selecting corresponding block BK0 and sense amplifier activation signal SE1 to invert a logical product of two signals and output the inverted logical product as a signal. Inverter 53A inverts a signal from NAND gate 52A to output a block-specific sense amplifier activation signal S(0).

When block BK0 is selected as an object for a read operation by a signal inputted externally, control circuit 110 outputs signal BLK0 at H level and sense amplifier activation signal SE1 at H level. Thereby, activation circuit 34A outputs block-specific sense amplifier activation signal S(0) at H level.

On the other hand, when block BK0 is caused to be in non-selected state as an object for read operation or an operation other than read operation is designated thereto, by a signal inputted externally, control circuit 110 outputs one of signal BLK0 at L level and sense amplifier activation signal SE1 at L level. Thereby, activation circuit 34A outputs block-specific sense amplifier activation signal S(0) at L level.

Input/output circuit 210 and activation circuit 34A, according to the same operation as described above, write data from global bit line pairs GBL0 and /GBL0 to GBLm and /GBLm to respective bit line pairs BITi0 and /BITi0 to BITim and /BITim.

Input/output circuits 210 to 21m, according to the above operation, input/output data between global bit line pairs GBL0 and /GBL0 to GBLm and /GBLm, and corresponding bit line pairs BITi0 ad /BITi0 to BITim and /BITim.

Description will be given of an input/output operation for data to/from a memory cell. Taken up as an example is inputting/outputting data to/from memory cell MC provided at the intersection between word line WL0 and bit line pair BITi0 and /BITi0.

Control circuit 110 outputs signal BI_Y at L level to global Y decoder 92 and outputs signal BLK0 at H level and sense amplifier activation signal SE1 at H level to activation circuit 34A of block BK0. Note that a precondition here is that selection of word line WL0 is performed by global row decoder 91, select circuit 45 and gate 2110 of gate circuit 221.

NAND gates 980 to 98m of global Y decoder 92 decodes column address ADD2 for selecting global bit line pair GBL0 and /GBL0 to output decoded column address ADD2 to redundancy control circuit 973. In this case, since redundancy control circuit 973 receives no control signal for selecting spare global bit line pair GBLS from disable circuit 93B, redundancy control circuit 973 outputs column address ADD2 to NOR gates 960 to 96m and 972. Inverter 974 inverts signal BI_Y at L level to output a signal at H level to NOR gates 960 to 96m and 972.

NOR gates 960 to 96m and 972 output signals for selecting global bit line pair GBL0 on the basis of column address ADD2 to inverters 950 to 95m and 970. To be concrete, NOR gate 960 outputs a signal at H level to inverter 950 and NOR gates 961 to 96m and 972 output signals at L level to respective inverters 951 to 95m and 970.

Then, inverter 950 inverts the signal at H level to output a signal at L level and activate global bit line pair GBL0. Inverters 951 to 95m and 970 invert the signals at L level to output signals at H level and deactivate respective global bit line pairs GBl1 to GBLm and GBLS.

Read register/write driver 51 outputs write data DA to sense amplifier SA1 of input/output peripheral circuit 23 and sense amplifier SA1 outputs write data DA to input/output lines IO and /IO.

Y gate 240 is activated by column address Y0 to write data DA on input/output lines IO and /IO onto activated global bit line pair GBL0 and /GBL0. Furthermore, Y gate 240 inverts column address Y0 to output column address /Y0 to input/output circuit 210. In this case, since global bit line pair GBL0 and /GBL0 is activated at L level, write data DA can be written onto global bit line pair GBL0 and /GBL0.

Since Y gates 241 to 24m are deactivated by column address Y1 to Ym, write data on input/output lines IO and /IO is not written onto global bit line pairs GBL1 and /GBL1 to GBLm and /GBLm.

Thereafter, activation circuit 34A outputs block-specific sense amplifier activation signal S(0) at H level on the basis of signal BLK0 at H level and sense amplifier activation signal SE1 at H level. Input/output circuit 210, according to the above operation, writes write data DA on global bit line pair GBL0 and /GBL0 onto corresponding bit line pair BITi0 and /BITi0. By doing so, write data DA is written to memory cell MC disposed at the intersection between word line WL0 and bit line pair BITi0 and /BITi0.

Next, description will be given of read operation. Control circuit 110 outputs the same signal BI_Y and other signals as in write operation. Global Y decoder 92 activates global bit line pair GBL0 (GBL0 and /GBL0) according to the same operation as in write operation. Furthermore, activation circuit 34A also outputs block-specific sense amplifier activation signal S(0) according to the same operation as in write operation. Y gate 240 connects bit line pair BITi0 and /BITi0 to global bit line pair GBL0 (GBL0 and /GBL0) according to the same operation as in write operation to invert column address Y0 and to output column address /Y0.

Then, read data read out from memory cell MC disposed at the intersection between word line WL0 and bit line pair BITi0 and /BITi0 is outputted to input/output lines IO and /IO through bit line pair BITi0 and /BITi0, input/output circuit 210, global bit line pair GBL0 and /GBL0, and Y gate 240.

Sense amplifier SA1 receives read data from input/output lines IO and /IO to amplify the received read data and to output the amplified data to sense amplifier SA2. Sense amplifier SA2 amplifies the read data from sense amplifier SA1 to output the amplified data to read register/write driver 51. Read register/write driver 51 outputs the read data to outside. With the outputting to outside, read operation of data from memory cell ends.

Control circuit 110, in burn-in test mode, outputs signal BI_Y at H level to global Y decoder 92. Then, inverter 974 inverts signal BI_Y at H level to output a signal at L level to the other terminals of NOR gates 960 to 96m and 972.

Since NOR gates 960 to 96m and 972 receive signals at H levels obtained by inverting the signal at L level outputted from inverter 974 at the other terminals, NOR gates 960 to 96m and 972 output signals at H level to respective inverter 950 to 95m and 970 with no respect to a logical level of signals from redundancy control circuit 973. Inverters 950 to 95m and 970 inverts the signals at H level to output signals at L level and to activate global bit line pairs GBL0 to GBLm and GBLS.

In burn-in test mode, since column address Y0 to Ym is inputted such that data is written to all of activated global bit line pairs GBL0 to GBLm, Y gates 240 to 24m are all activated by column address Y0 to Ym to connect global bit line pairs GBL0 and /GBL0 to GBLm and /GBLm to input/output lines IO and /IO.

Read register/write driver 51 writes write data DA onto input/output lines IO and /IO through sense amplifier SA1 and Y gates 240 to 24m write write data DA on input/output lines IO and /IO onto global bit line pairs GBL0 and /GBL0 to GBLm and /GBLm.

Input/output circuits 210 to 21m receives block-specific sense amplifier activation signal S(0) and column address /Y0 to /Ym to write write data DA on global bit line pairs GBL0 and /GBL0 to GBLm and /GBLm onto respective bit line pairs BITi0 and /BITi0 to BITim and /BITim.

In burn-in test mode, since even-numbered word lines or odd-numbered word lines are simultaneously activated, data is simultaneously written to memory cells connected to even-numbered word line or memory cells connected to odd-numbered word lines each set as a unit.

Since input/output peripheral circuits 26, 29, 32, 35, 38, 41 and 44 each have the same configuration as input/output peripheral circuit 23, blocks 24, 27, 30, 33, 36, 39 and 42 each have the same configuration as block 21 and global Y decoder 95 has the same configuration as global Y decoder 92, inputting/outputting data to/from memory cells included in blocks 24, 27, 30, 33, 36, 39 and 42 is performed according to the same operation as in the above described operation.

Figure 9:
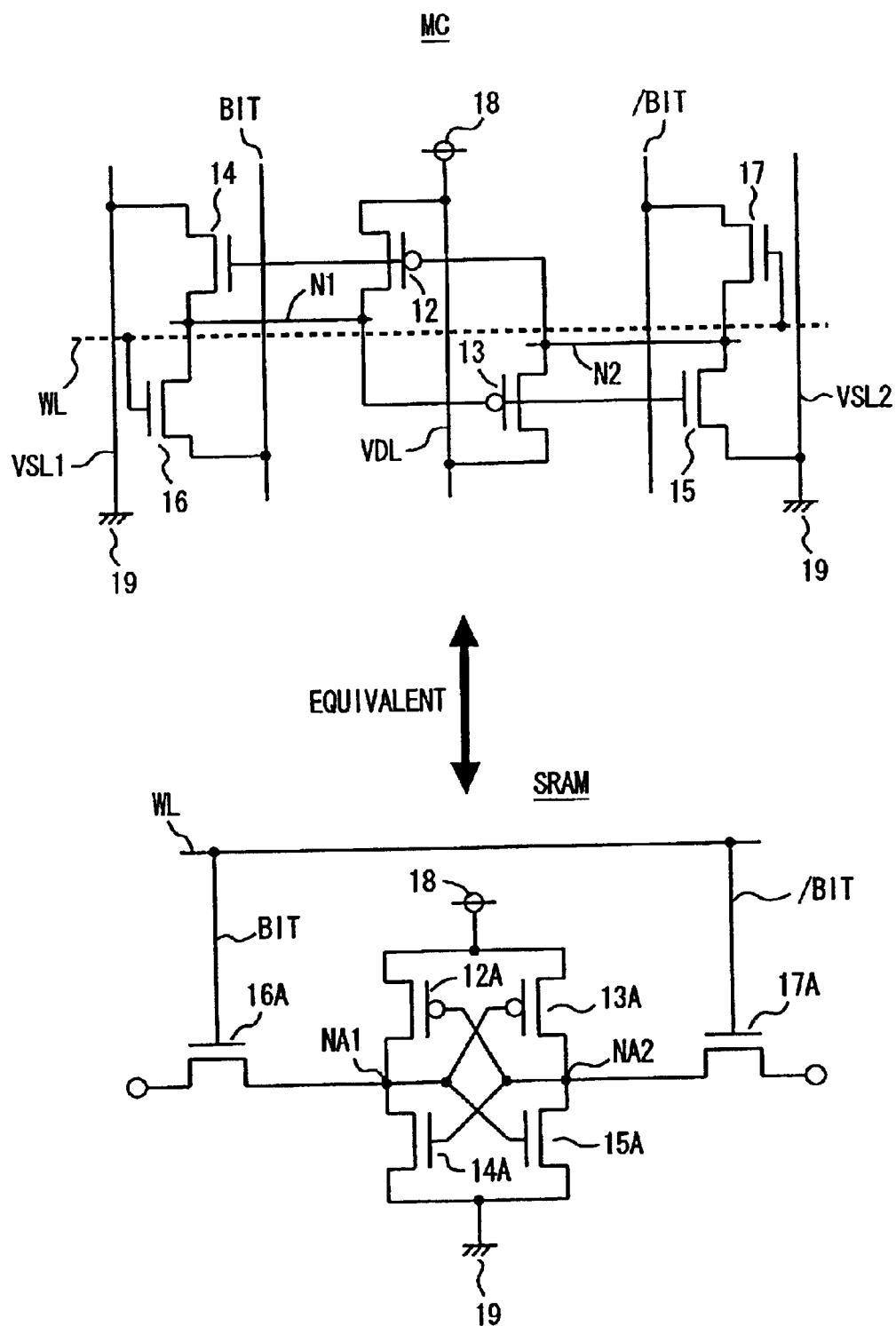
FIG. 9 is a circuit diagram of a static random access memory.

Referring to FIG. 9, memory cell MC includes P-channel MOS transistors 12 and 13, N-channel MOS transistors 14 to 17 and nodes N1 and N2.

In P-channel MOS transistor 12, one conductive terminal thereof is connected to power supply line VDL, the other conductive terminal thereof is connected to the gate terminal of P-channel MOS transistor 13 and the gate terminal thereof is connected to the other conductive terminal of P-channel MOS transistor 13.

In P-channel MOS transistor 13, one conductive terminal thereof is connected to power supply line VDL, the other conductive terminal thereof is connected to the gate terminal of P-channel MOS transistor 12 and the gate terminal thereof is connected to the other conductive terminal of P-channel MOS transistor 12.

In N-channel MOS transistor 14, one conductive terminal thereof is connected to ground line VSL1, the other conductive terminal thereof is connected to the other conductive terminal of N-channel MOS transistor 16 and the gate terminal thereof is connected to the other conductive terminal of P-channel MOS transistor 13.

In N-channel MOS transistor 15, one conductive terminal thereof is connected to ground line VSL2, the other conductive terminal thereof is connected to the other conductive terminal of N-channel MOS transistor 17 and the gate terminal thereof is connected to the other conductive terminal of P-channel MOS transistor 12.

In N-channel MOS transistor 16, one conductive terminal thereof is connected to bit line BIT, the other conductive terminal thereof is connected to the other conductive terminal of N-channel MOS transistor 14 and the gate terminal thereof is connected to word line WL.

In N-channel MOS transistor 17, one conductive terminal thereof is connected to bit line /BIT, the other conductive terminal thereof is connected to the other conductive terminal of N-channel MOS transistor 15 and the gate terminal thereof is connected to word line WL.

Node N1 is formed by connecting the other conductive terminals of P-channel MOS transistor 12 and N-channel MOS transistor 14 and 16 with each other and node N2 is formed by connecting the other conductive terminals of P-channel MOS transistor 13 and N-channel MOS transistor 15 and 17 with each other.

P-channel MOS transistor 12 is turned off when node N2 is raised to H level, while being turned on when node N2 is lowered to L level to supply power supply voltage to node N1 from power supply node 18 through power supply line VDL such that node N1 assumes H level. P-channel MOS transistor 13 is turned off when node N1 is raised to H level, while being turned on when node N1 is lowered to L level to supply power supply voltage to node N2 from power supply node 18 through power supply line VDL such that node N2 assumes H level.

Since P-channel MOS transistors 12 and 13, in such a way, supply power supply voltage to nodes N1 and N2 from power supply node 18 according to potential levels of nodes N1 and N2, the transistors are called load transistors.

N-channel MOS transistor 14 is turned on when node N2 is raised to H level to supply an electric charge on node N1 to ground node 19 through ground line VSL1 to lower node N1 to L level, while being turned off when node N2 is lowered to L level to hold an electric charge on node N1. N-channel MOS transistor 15 is turned on when node N1 is raised to H level to supply an electric charge on node N2 to ground node 19 through ground line VSL2 to lower node N2 to L level, while being turned off when node N1 is lowered to L level to hold an electric charge on node N2.

Since N-channel MOS transistors 14 and 15, in such a way, supply electric charges on nodes N1 and N2 to ground node 19 or hold electric charges on nodes N1 and N2 according to potential levels of nodes N1 and N2, the transistors are called driver transistors.

N-channel MOS transistor 16 is turned on when word line WL is selected to supply an electric charge on bit line BIT to node N1, while cutting off supplying/receiving an electric charge between bit line BIT and node N1 when word line WL is caused to be in non-selected state. N-channel MOS transistor 17 is turned on when word line WL is selected to supply an electric charge on bit line /BIT to node N2, while cutting off supplying/receiving an electric charge between bit line /BIT and node N2 when word line WL is caused to be in non-selected state.

Since N-channel MOS transistors 16 and 17 perform supply/receipt of an electric charge between node N1 and bit line BIT or supply/receipt of an electric charge between node N2 and bit line /BIT through word line WL, the transistors are called access transistors.

Memory cell MC has the same configuration as that in static random access memory SRAM. That is, P-channel MOS transistors 12 and 13, N-channel MOS transistors 14 to 17 and nodes N1 and N2 in memory cell MC correspond with P-channel MOS transistors 12A and 13A, N-channel MOS transistors 14A to 17A and nodes NA1 and NA2, respectively, in static random access memory SRAM.

Therefore, semiconductor memory device 100 includes memory cells each constituted of P-channel MOS transistors 12 and 13, N-channel MOS transistors 14 to 17, and nodes N1 and N2. As a result, in memory cell MC, nodes N1 and N2 assume H level and L level, respectively, when data "1" is written, while assuming L level and H level, respectively, when data "0" is written.

Figure 10:
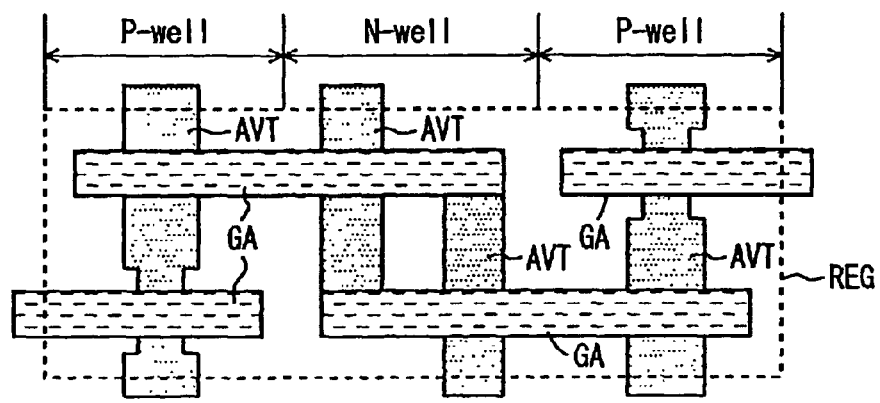
FIG. 10 is a plan view of the lowest layer (A) constituting the static random access memory.

Referring to FIGS. 10 to 15, description will be given of fabrication of a memory cell MC. Referring to FIG. 10, memory cell MC is fabricated in a region REG. FIG. 10 shows the lowest layer (A) of memory cell (MC). Active layers AVT are formed in two P-wells and two active layers AVT and AVT are formed in N-well. Then, 4 gate electrodes GA are formed in the direction perpendicular to 4 active layers AVT.

Figure 11:
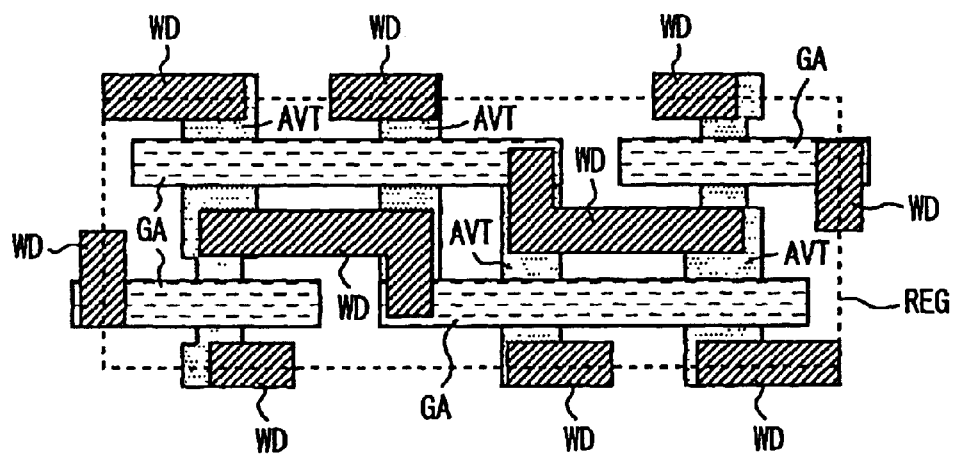
FIG. 11 is a plan view of a layer (B) formed on the lowest layer (A) shown in FIG. 10.

Referring to FIG. 11, description will be given of a layer (B) formed on the lowest layer (A). Ten tungsten damascenes WD are formed in region REG of memory cell (MC).

Figure 12:
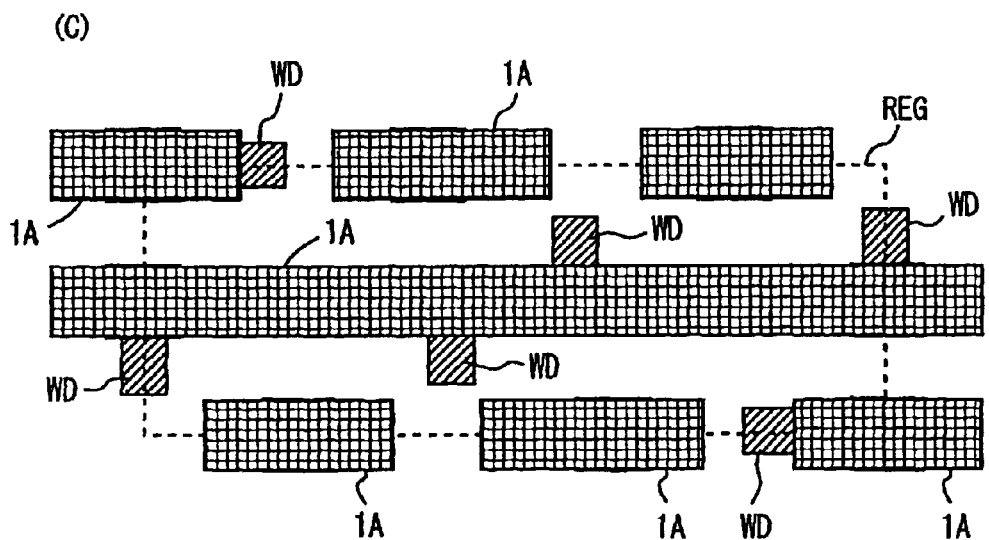
FIG. 12 is a plan view of a layer (C) formed on the layer (B) shown in FIG. 11.

Referring to FIG. 12, description will be given of a layer (C) formed on layer (13). An aluminum interconnects 1A in a first layer is formed on 10 damascenes WD formed in layer B so as to cover almost the 10 damascenes WD. Aluminum interconnect 1A in the first layer extending in the direction, left to right, in almost the middle portion of region REG in the direction, above to below, constitutes word line WL.

Figure 13:
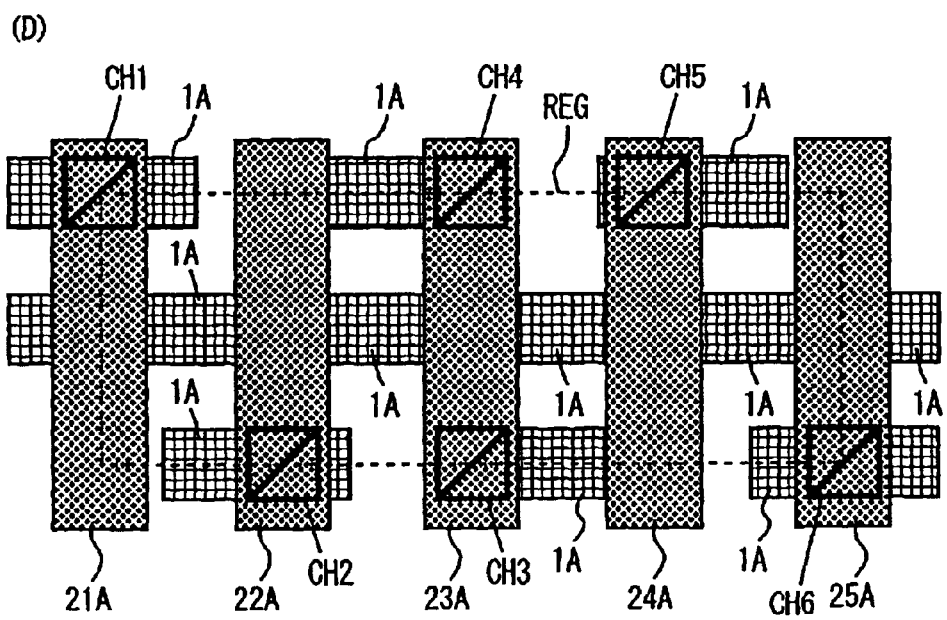
FIG. 13 is a plan view of a layer (D) formed on the layer (C) shown in FIG. 12.

Referring to FIG. 13, description will be given of a layer (D) formed on layer (C). Aluminum interconnects 21A to 25A in a second layer are formed in the direction perpendicular to aluminum interconnects 1A in the first layer formed in layer (C). Aluminum interconnect 21A in the second layer is ground line VSL1, aluminum interconnect 22A in the second layer is bit line BIT, aluminum interconnect 23A in the second layer is power supply line VDL, aluminum interconnect 24A in the second layer is bit line /BIT and aluminum interconnect 25A in the second layer is ground line VSL2.

Contact hole CH1 connects aluminum interconnect 21A in the second layer as ground line VSL1 to aluminum interconnect 1A in the first layer. Contact hole CH2 connects aluminum interconnect 22A in the second layer as bit line BIT to aluminum interconnect 1A in the first layer. Contact holes CH3 and CH4 connect aluminum interconnect 23A in the second layer as power supply line VDL to aluminum interconnect 1A in the first layer. Contact hole CH5 connects aluminum interconnect 24A in the second layer as bit line /BIT to aluminum interconnect 1A in the first layer. Contact hole CH6 connects aluminum interconnect 25A in the second layer as ground line VSL2 to aluminum interconnect 1A in the first layer.

In this case, a spacing between aluminum interconnects 21A to 25A is about 0.3 µm.

Figure 14:
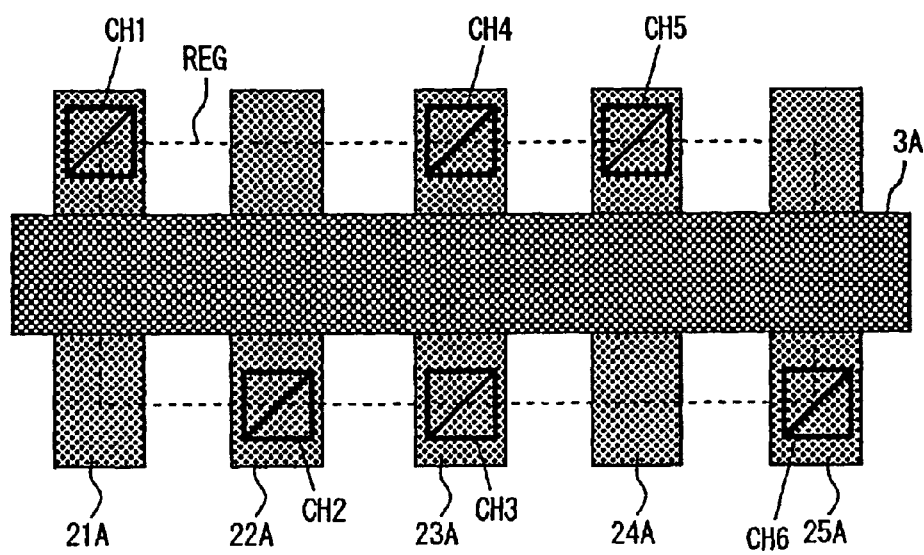
FIG. 14 is a plan view of a layer (E) formed on the layer (D) shown in FIG. 13.

Referring to FIG. 14, description will be given of a layer (E) formed on layer (D). An aluminum interconnect 3A is formed in a third layer in the direction perpendicular to aluminum interconnects 21A to 25A in the second layer. Aluminum interconnect 3A is global word line GWL or global bit line pair GBL or /GBL. Global word line GWL is placed in parallel to global bit line pair GBL and /GBL.

Figure 15:
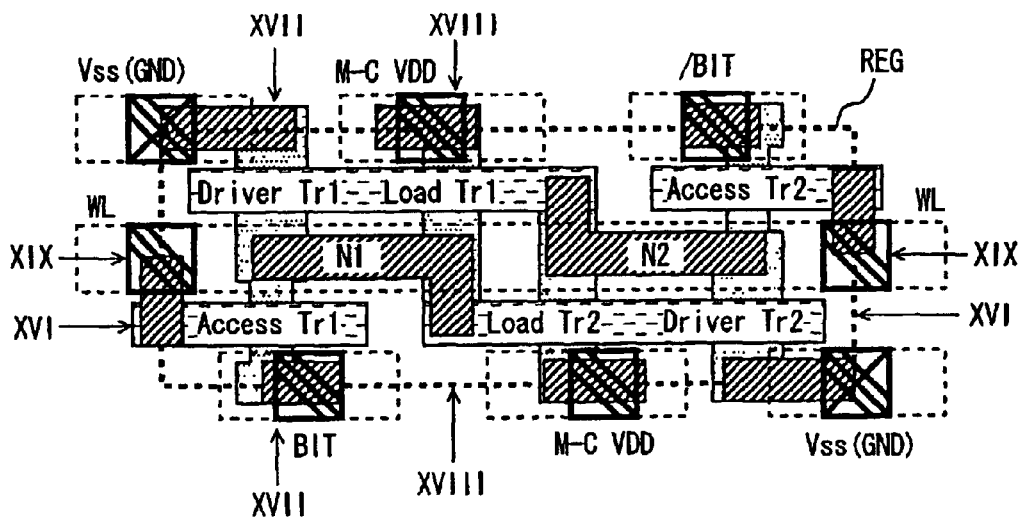
FIG. 15 is a plan view of a static random access memory.

Layers (A) to (E) shown in FIGS. 10 to 14 are sequentially stacked to form memory cell MC shown in FIG. 15. Referring to FIG. 15, Load Tr1 is P-channel MOS transistor 12 shown in FIG. 9, Driver Tr1 is N-channel MOS transistor 14 shown in FIG. 9, Access Tr1 is N-channel MOS transistor 16 shown in FIG. 9, Load Tr2 is P-channel MOS transistor 13 shown in FIG. 9, Driver Tr2 is N-channel MOS transistor 15 shown in FIG. 9, and Access Tr2 is N-channel MOS transistor 17 shown in FIG. 9.

Figure 16:
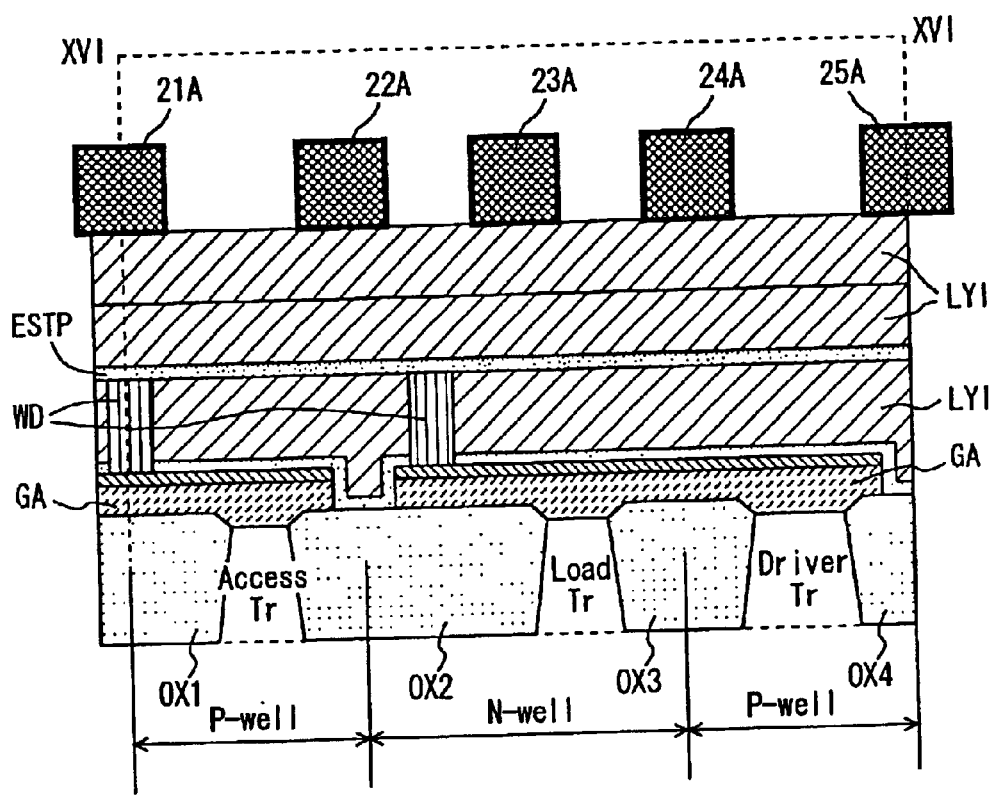
FIG. 16 is a sectional view taken on line XVI—XVI of FIG. 15.

FIG. 16 is a sectional view taken on line XVI—XVI of FIG. 15. Referring to FIG. 16, Access Tr is formed in one P-well region, Driver Tr is formed in the other P-well and Load Tr is formed in the central N-well region. Element isolation oxide films ox1 to ox4 are formed around Access Tr, Driver Tr and Load Tr. Access Tr, Driver Tr and Load Tr are mutually isolated therebetween.

Gate electrodes GA are formed on Access Tr, Driver Tr and Load Tr. Damascenes WD are formed on part of gate electrode GA and an interlayer insulating film LY1 is formed on the other part. Then, an etching stopper ESTP is formed on interlayer insulating film LY1 and interlayer insulating film LY1 is again formed on etching stopper ESTP. Then, finally, aluminum interconnects 21A to 25A in the second layer are formed.

In FIG. 16, tungsten damascene WD formed above element isolation oxide film ox2 is node N1.

Figure 17:
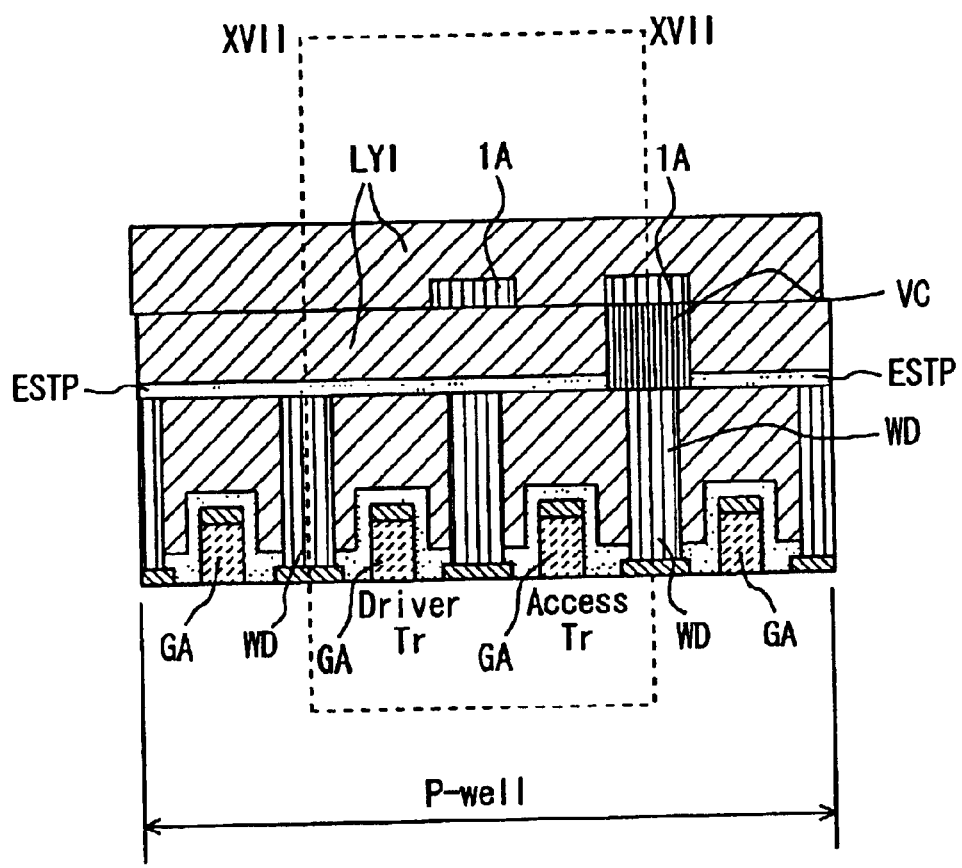
FIG. 17 is a sectional view taken on line XVII—XVII of FIG. 15.

FIG. 17 is a sectional view taken on line XVII—XVII of FIG. 15. Referring to FIG. 17, gate electrodes GA are formed on Driver Tr and Access Tr and tungsten damascenes WD are formed in regions where no gate electrode GA is formed. Interlayer insulating film LY1 is formed in a region other than where tungsten damascenes are formed.

A tungsten via contact VC is formed on the second tungsten damascene WD from the right, and etching stopper ESTP and interlayer insulating film LY1 are formed in the region else. In this case, interlayer insulating film LY1 is formed so as to cover aluminum interconnects 1A in the first layer.

Figure 18:
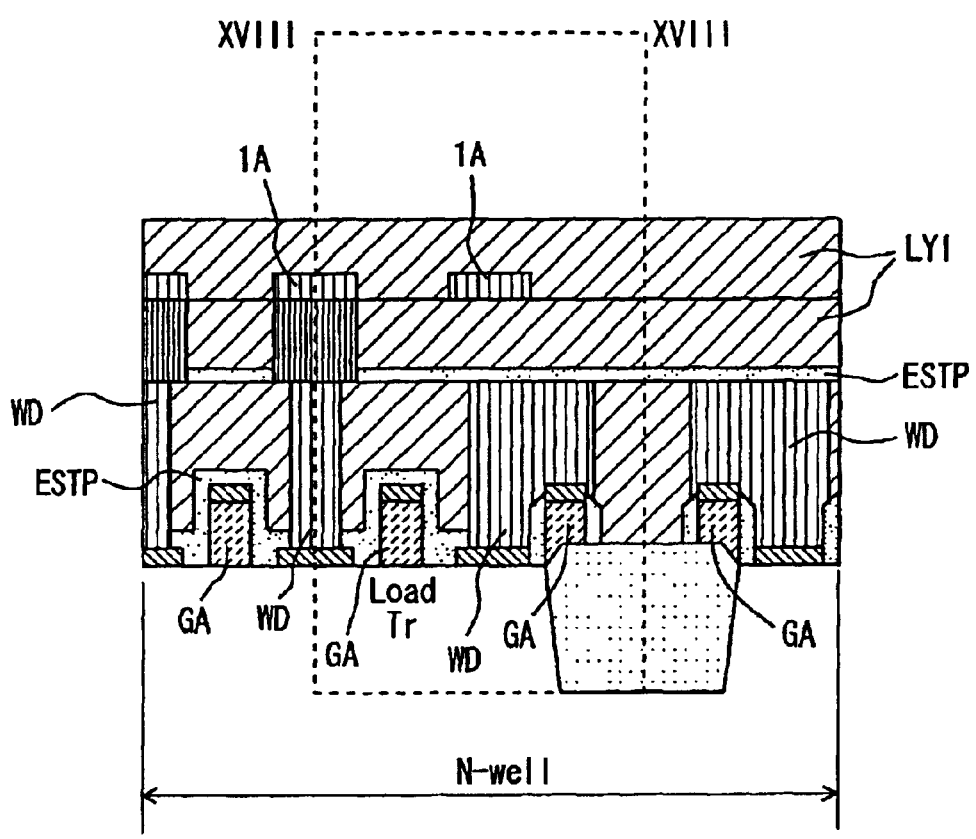
FIG. 18 is a sectional view taken on line XVIII—XVIII of FIG. 15.

FIG. 18 is a sectional view taken on line XVIII—XVIII of FIG. 15. Referring to FIG. 18, gate electrode GA is formed on Load Tr and tungsten damascenes WD are formed in the region where no gate electrode GA is formed. Interlayer insulating film LY1 is formed in the region where no tungsten damascene is formed.

Aluminum interconnect 1A in the first layer is formed on the second tungsten damascene from the left, and etching stopper RSTP and interlayer insulating film LY1 are formed in the other region. Aluminum interconnect 1A in the first layer is formed above the second damascene WD from the right in interlayer insulating film LY1.

Figure 19:
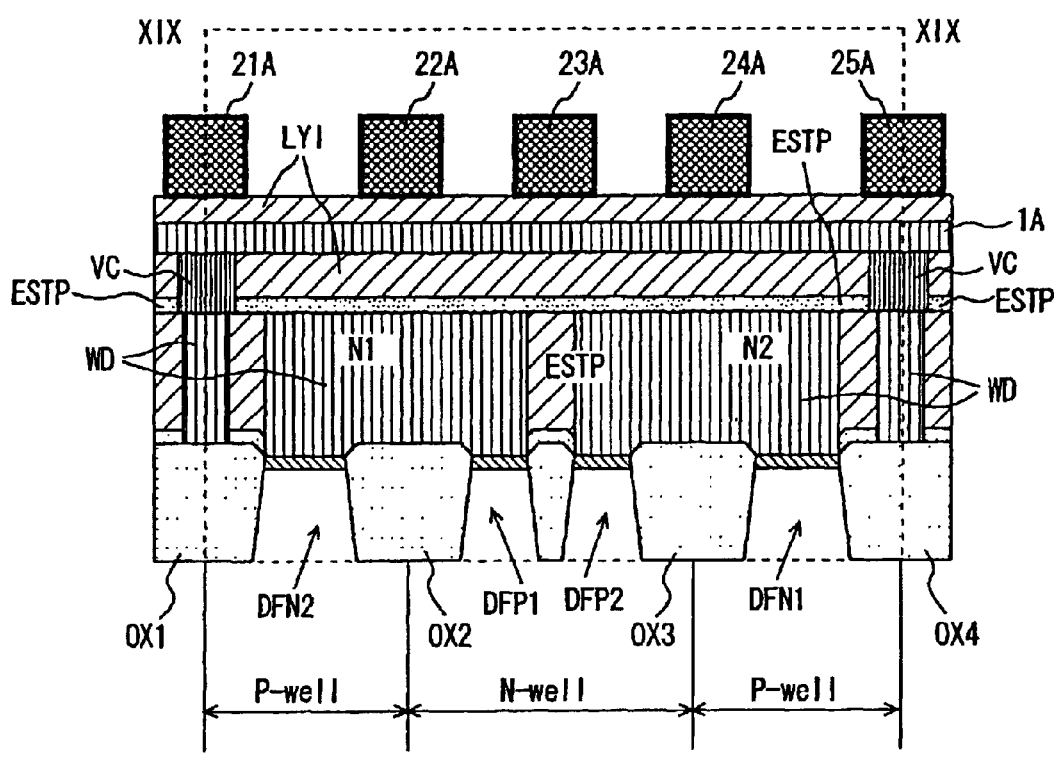
FIG. 19 is a sectional view taken on line XIX—XIX of FIG. 15.

FIG. 19 is a sectional view taken on line XIX—XIX of FIG. 15. Diffusion regions DFN1 and DFN2, and DFP1 and DFP2 are mutually isolated by element isolation oxide films ox1 to ox4 therebetween. Tungsten damascenes WD are formed on diffusion regions DFN1 and DFN2, and DFP1 and DFP2, and element isolation oxide films ox1 to ox4 and interlayer insulating film LY1 is formed in the region where no damascene WD is formed.

Tungsten via contacts VC are formed on tungsten damascene WD at both ends in the figure. Etching stopper ESTP and interlayer insulating film LY1 are formed between two tungsten via contacts VC. Aluminum interconnects 1A in the first layer are formed on two tungsten via contacts VC so as to connect two tungsten via contacts VC therebetween.

Interlayer insulating film LY1 is formed on aluminum interconnects 1A in the first layer and aluminum interconnects 21A to 25A in the second layer are finally formed.

Description will be given of burn-in test according to the present invention. Table 1 shows test patterns in burn-in test according the present invention.

TABLE 1

| Test Pattern | BI_0 Even Number | BI_1 Odd Number | Column Signals (Bit,/Bit) | Global X | Global Y | Stress Pattern | Note |
|---|---|---|---|---|---|---|---|
| 1 | 1 | 0 | 1/0 | 1 | 1 | | 1 is written to even-numbered rows |
| 2 | 0 | 1 | 0/1 | 1 | 1 | row stripe (even/odd = 1/0) | 0 is written to odd-numbered row |
| 3 | 1 | 0 | 0/1 | 1 | 1 | ALL_0 | 1 is written to even-numbered row |
| 4 | 0 | 1 | 1/0 | 1 | 1 | row stripe (even/odd = 1/0) | 0 is written to even-numbered row |
| 5 | 1 | 0 | 1/0 | 1 | 1 | ALL_1 | 1 is written to even-numbered rows |
| 5-B | 0 | 0 | 0/1 | 1 | 1 | ALL-1, bit line-node N1 stress | bit lines activated, word lines off |
| 5-C | 0 | 0 | 1/0 | 1 | 1 | ALL-1, bit line-node N2 stress | bit lines activated, word lines off |
| 6 | 0 | 0 | — | 1 | 0 | global X stress | |
| 7 | 0 | 0 | — | 0 | 1 | global Y stress | |

Burn-in test according to the present invention includes test patterns 1 to 5, 5-B, 5-C, 6 and 7.

Test pattern 1 is an operation in which a burn-in test signal BI_0 is set to H level, a burn-in test signal BI_1 is set to L level (in Table 1, "1" indicates H level, "0" indicates L level), even-numbered word lines are selected while odd-numbered word lines are caused to be in non-selected state, and data "1" is written to memory cells connected to the even-numbered word lines.

Test pattern 2 is an operation in which burn-in test signal BI_0 is set to L level, burn-in test signal BI_1 is set to H level, even-numbered word lines are caused to be in non-selected state while odd-numbered word lines are selected, and data "0" is written to memory cells connected to the odd-numbered word lines. With the operation, since data "1" is written to memory cells connected to the even-numbered word lines and data "0" is written to memory cells connected to odd-numbered word lines, memory cells at L level are located in a pattern of stripes when the entire memory cells are viewed from above (also referred to as row stripes).

Test pattern 3 is an operation in which a burn-in test signal BI_0 is set to H level, a burn-in test signal BI_1 is set to L level, even-numbered word lines are selected while odd-numbered word lines are caused to be in non-selected state, and data "0" is written to memory cells connected to the even-numbered word lines. With the operation, data "0" is written to all of the memory cells (ALL_0).

Test pattern 4 is an operation in which a burn-in test signal BI_0 is set to L level, a burn-in test signal BI_1 is set to H level, even-numbered word lines are caused to be in non-selected state while odd-numbered word lines are selected and data "1" is written to memory cells connected to the odd-numbered word lines. With the operation, data "0" is written to memory cells connected to the even-numbered word lines, while data "1" is written to memory cells connected to the odd-numbered word lines, therefore, memory cells at L level are located in a pattern of stripes when the entire memory cells are viewed from above (also referred to as row stripes).

Test pattern 5 is an operation in which a burn-in test signal BI_0 is set to H level, a burn-in test signal BI_1 is set to L level, even-numbered word lines are selected while odd-numbered word lines are caused to be in non-selected state, and data "1" is written to memory cells connected to the even-numbered word lines. With the operation, data "1" is written to all of the memory cells (ALL_1).

Test pattern 5-B is an operation in which in a state where data "1" is written to all the memory cells, all the word lines are caused to be in non-selected state and bit lines BITi0 to BITim of bit line pair BITi0 and /BITi0 to BITim and /BITim are held at L level, while bit lines /BITi0 to /BITim thereof are held at H level.

Test pattern 5-C is an operation in which in a state where data "1" is written to all the memory cells, all the word lines are caused to be in non-selected state and bit lines BITi0 to BITim of bit line pair BITi0 and /BITi0 to BITim and /BITim are held at H level, while bit lines /BITi0 to /BITim thereof are held at L level.

Test pattern 6 is an operation in which all the word lines and all the bit line pairs are caused to be in non-selected state and global word lines GWL1 to GWLn are set to H level while global bit line pairs GBL0 to GBLm are set to L level.

Test pattern 7 is an operation in which all the word lines and all the bit line pairs are caused to be in non-selected state and global word lines GWL1 to GWLn are set to L level while global bit line pairs GBL0 to GBLm are set to H level.

As is clear from Table 1, test patterns 1 to 5 are burn-in tests in which even-numbered word lines and odd-numbered word lines are alternately selected and data "1" or data "0" is written to memory cells to thereby apply a stress.

Test patterns 5-B and 5-C are burn-in tests in which word lines are caused to be in non-selected state and data "1" or data "0" is written onto a bit line pair to thereby apply a stress.

Furthermore, test patterns 6 and 7 are burn-in tests in which word lines and bit lines are caused to be in non-selected state and global word lines or global bit lines are set to H level or L level to thereby apply a stress.

When test patterns shown in Table 1 are implemented, an address for causing transition of semiconductor memory device 100 to a burn-in test including test patterns is inputted externally. Therefore, addresses ADB for causing transition of semiconductor memory device 100 to a burn-in tests described above includes addresses ADB1 to ADB9.

Control circuit 110, when receiving address ADB1, ADB3 and ADB5, generates burn-in test signals BI and BI_0 at H level and burn-in test signal BI_1 at L level to output the test signals to predecoder 120. Thereby, even-numbered word lines are simultaneously selected.

Control circuit 110, when receiving address ADB2 and ADB4, generates burn-in test signals BI and BI_0 at H level and burn-in test signal BI_0 at L level to output the test signals to predecoder 120. Thereby, odd-numbered word lines are simultaneously selected.

Control circuit 110, when receiving address ADB6 to ADB9, generates burn-in test signal BI at H level and burn-in test signals BI_0 and BI_1 at L level to output the test signals to predecoder 120.

Figure 20:
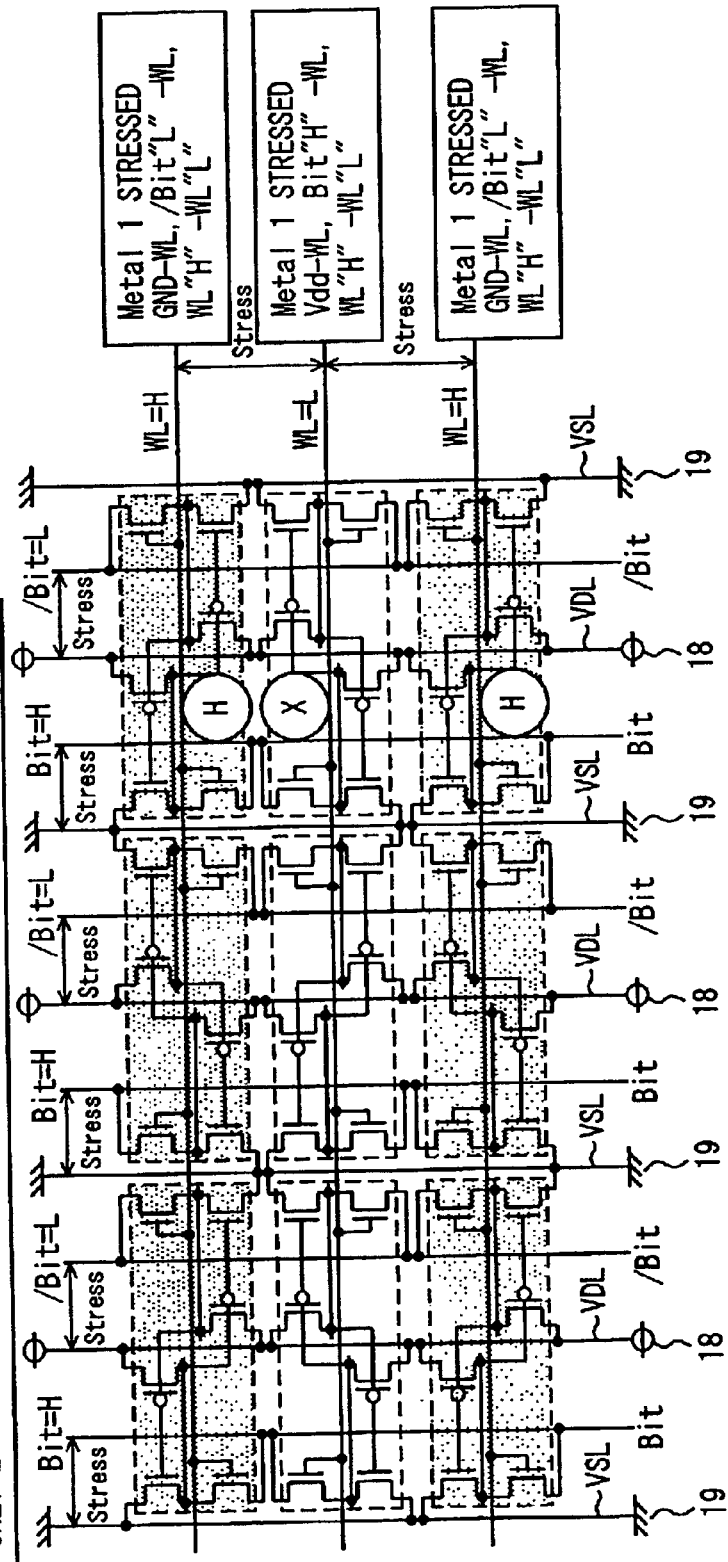
FIG. 20 is an illustration showing stresses applied on a static random access memory.

Referring to FIG. 20, description will be given of stresses applied when test pattern 1 is performed. Note that a double-headed arrow mark in the figure shows a stress and X indicates that it is indefinite whether data is "0" or "1".

In this case, data "1" is written to memory cells connected to even-numbered word lines. Therefore, even numbered word lines are raised to H level, and bit line BIT assumes H level while bit line /BI assumes L level, of bit line pair BIT and /BIT connected to one memory cell.

In such a situation, since ground line VSL, bit line BIT, power supply line VDL and bit line /BIT have a spacing between adjacent lines of about 0.3 μm, stresses are applied mainly between adjacent lines: ground line VSL and bit line BIT, power supply line VDL and bit line /BIT, an even-numbered word line and an odd-numbered word line adjacent thereto, an even-numbered word line and ground line VSL, an even-numbered word line and bit line /BIT, power supply line VDL and an odd-numbered word line, node N1 and ground line VSL, node N2 and power supply line VDL, node N2 and an even-numbered word line, and bit line BIT and an odd-numbered word line.

Figure 21:
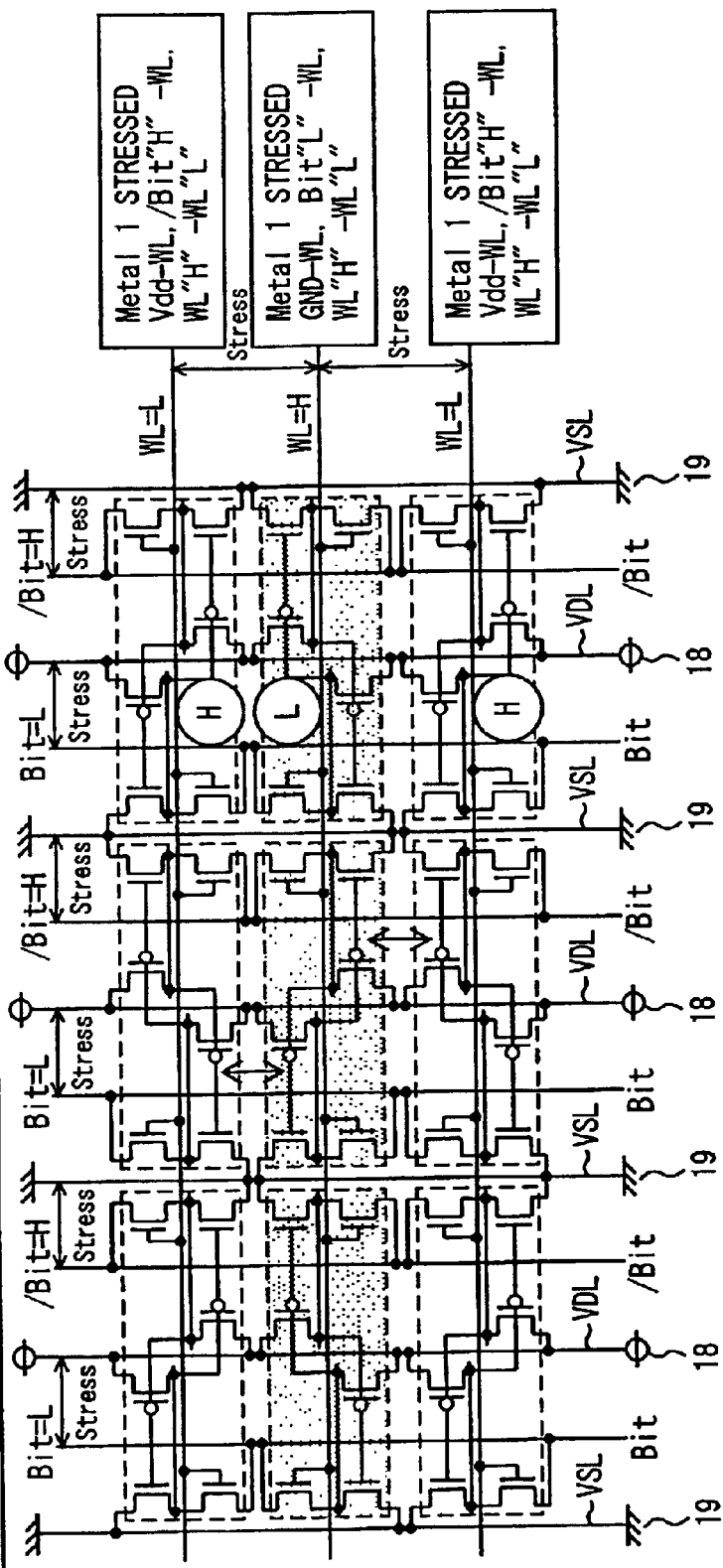
FIG. 21 is another illustration showing stresses applied on the static random access memory.

Referring to FIG. 21, description will be given of a stress applied when test pattern 2 is performed. Note that a double-headed arrow mark indicates a stress.

In this case, data "0" is written to memory cells connected to odd-numbered word lines. Therefore, odd-numbered word lines assume H level, and bit line BIT assumes L level and bit line /BI assumes H level, of bit line pair BIT and /BIT connected to one memory cell.

In such a situation, stresses are applied mainly between adjacent lines: ground line VSL and bit line /BIT, power supply line VDL and bit line BIT, an odd-numbered word line and an even-numbered word line adjacent thereto, an even-numbered word line and power supply line VDL, an even-numbered word line and bit line /BIT, ground line VSL and an odd-numbered word line, node N1 and ground line VSL, node N1 and an even-numbered word line, node N1 and an odd-numbered word line, node N2 and power supply line VDL, node N2 and ground line VSL, and bit line BIT and an odd-numbered word line.

Figure 22:
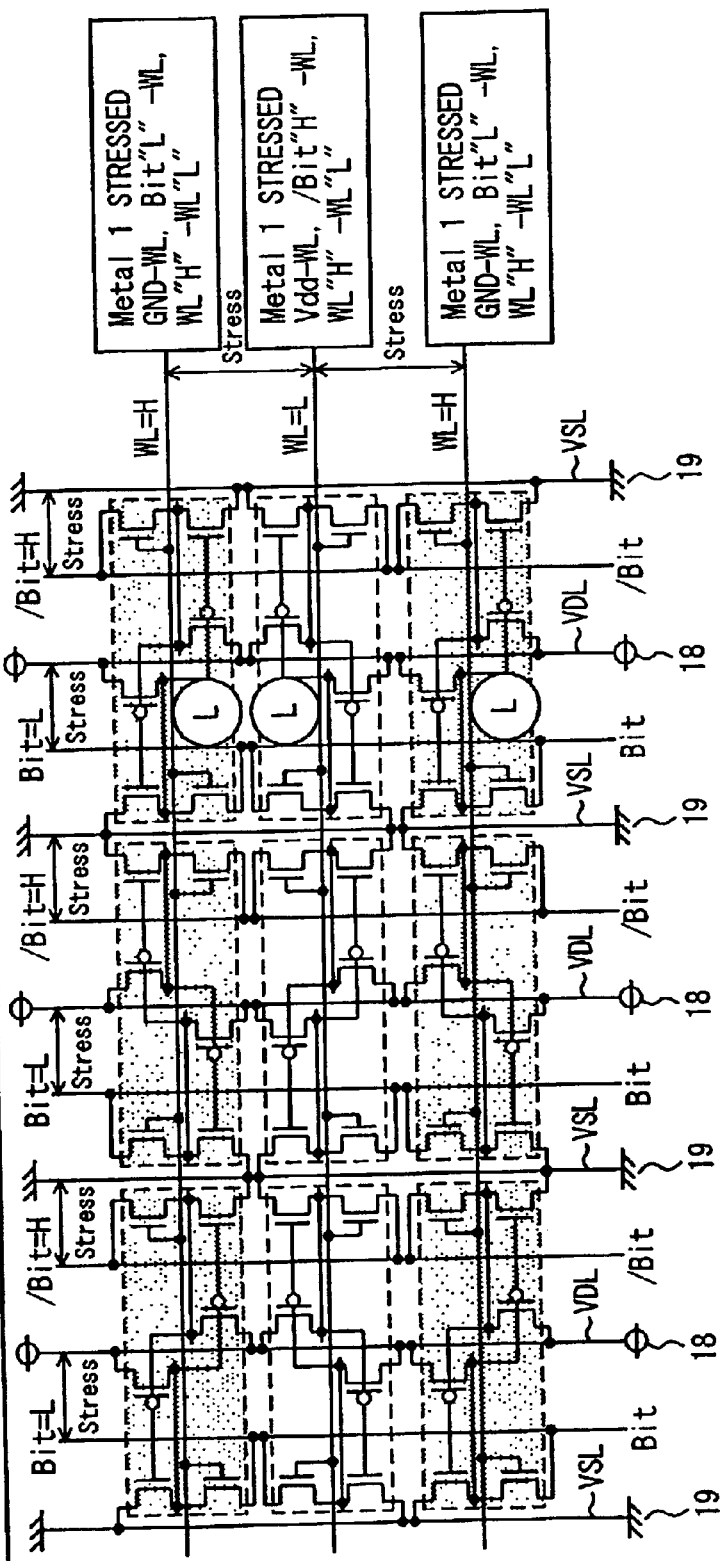
FIG. 22 is still another illustration showing stresses applied on the static random access memory.

Referring to FIG. 22, description will be given of a stress applied when test pattern 3 is performed. Note that a double-headed arrow mark indicates a stress.

In this case, data "0" is written to memory cells connected to even-numbered word lines. Therefore, even-numbered word lines assume H level, and bit line BIT assumes L level and bit line /BIT assumes H level, of bit line pair BIT and /BIT connected to one memory cell.

In such a situation, stresses are applied mainly between adjacent lines: ground line VSL and bit line /BIT, power supply line VDL and bit line BIT, an even-numbered word line and an odd-numbered word line adjacent thereto, an even-numbered word line and ground line VSL, an even-numbered word line and bit line BIT, power supply line VDL and an odd-numbered word line, node N1 and power supply line VDL, node N1 and an even-numbered word line, node N2 and ground line VSL, node N2 and an odd-numbered word line, and bit line /BIT and an odd-numbered word line. In this case, since data "0" is written to memory cells connected to even-numbered word lines and memory cells connected to odd-numbered word lines, all of node N2 of memory cells each existing between bit line BIT and power supply line VDL show L level (ALL_0).

Figure 23:
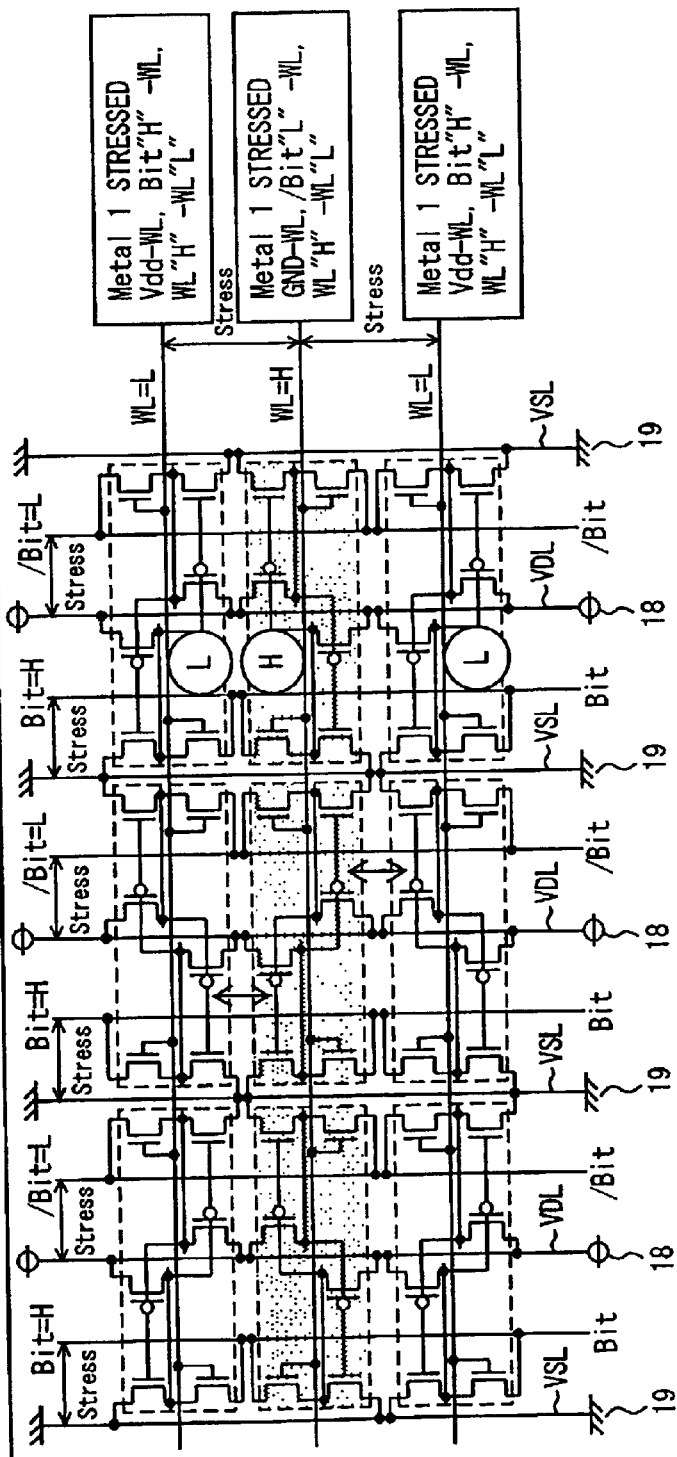
FIG. 23 is yet another illustration showing stresses applied on the static random access memory.

Referring to FIG. 23, description will be given of a stress applied when test pattern 4 is performed. Note that a double-headed arrow mark indicates a stress.

In this case, data "1" is written to memory cells connected to odd-numbered word lines. Therefore, odd-numbered word lines assume H level, and bit line BIT assumes H level and bit line /BI assumes L level, of bit line pair BIT and /BIT connected to one memory cell.

In such a situation, stresses are applied mainly between adjacent lines: ground line VSL and bit line BIT, power supply line VDL and bit line /BIT, an odd-numbered word line and an even-numbered word line adjacent thereto, an even-numbered word line and power supply line VDL, an even-numbered word line and bit line BIT, ground line VSL and an odd-numbered word line, node N1 and power supply line VDL, node N2 and ground line VSL, node N1 and ground line VSL, node N2 and ground line VSL, node N2 and an odd-numbered word line and bit line /BIT and an odd-numbered word line.

Figure 24:
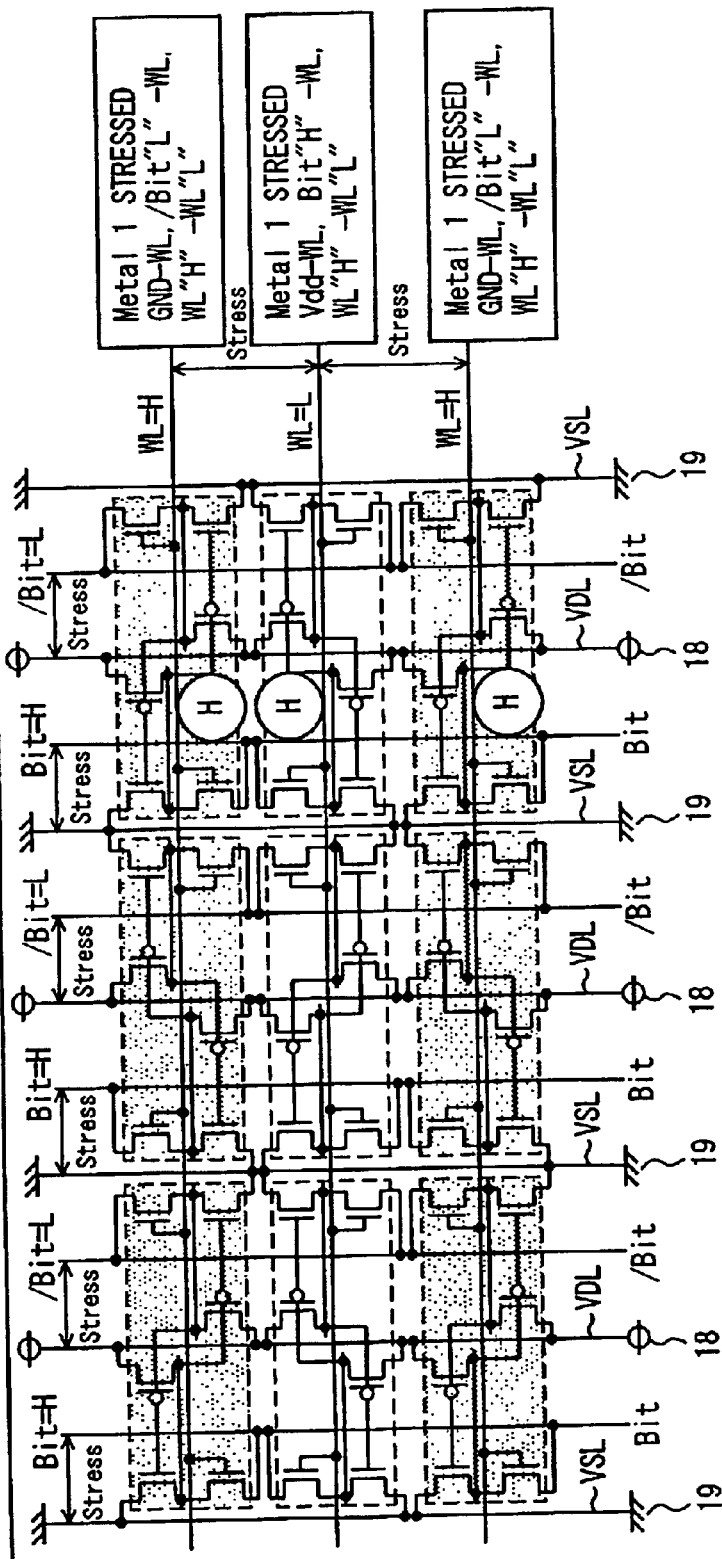
FIG. 24 is a further illustration showing stresses applied on the static random access memory.

Referring to FIG. 24, description will be given of a stress applied when test pattern 5 is performed. Note that a double-headed arrow mark indicates a stress.

In this case, data "1" is written to memory cells connected to even-numbered word lines. Therefore, even-numbered word lines assume H level, and bit line BIT assumes H level and bit line /BIT assumes L level, of bit line pair BIT and /BIT connected to one memory cell.

In such a situation, stresses are applied mainly between adjacent lines: ground line VSL and bit line BIT, power supply line VDL and bit line /BIT, an even-numbered word line and an odd-numbered word line adjacent thereto, an even-numbered word line and ground line VSL, an even-numbered word line and bit line /BIT, power supply line VDL and an odd-numbered word line, node N1 and ground line VSL, node N2 and power supply line VDL, node N2 and an even-numbered word line, node N1 and an odd-numbered word line, and bit line BIT and an odd-numbered word line. In this case, since data "1" is written to memory cells connected to even-numbered word lines and memory cells connected to odd-numbered word lines, all of node N2 of memory cells each existing between bit line BIT and power supply line VDL show H level (ALL_1).

Figure 25:
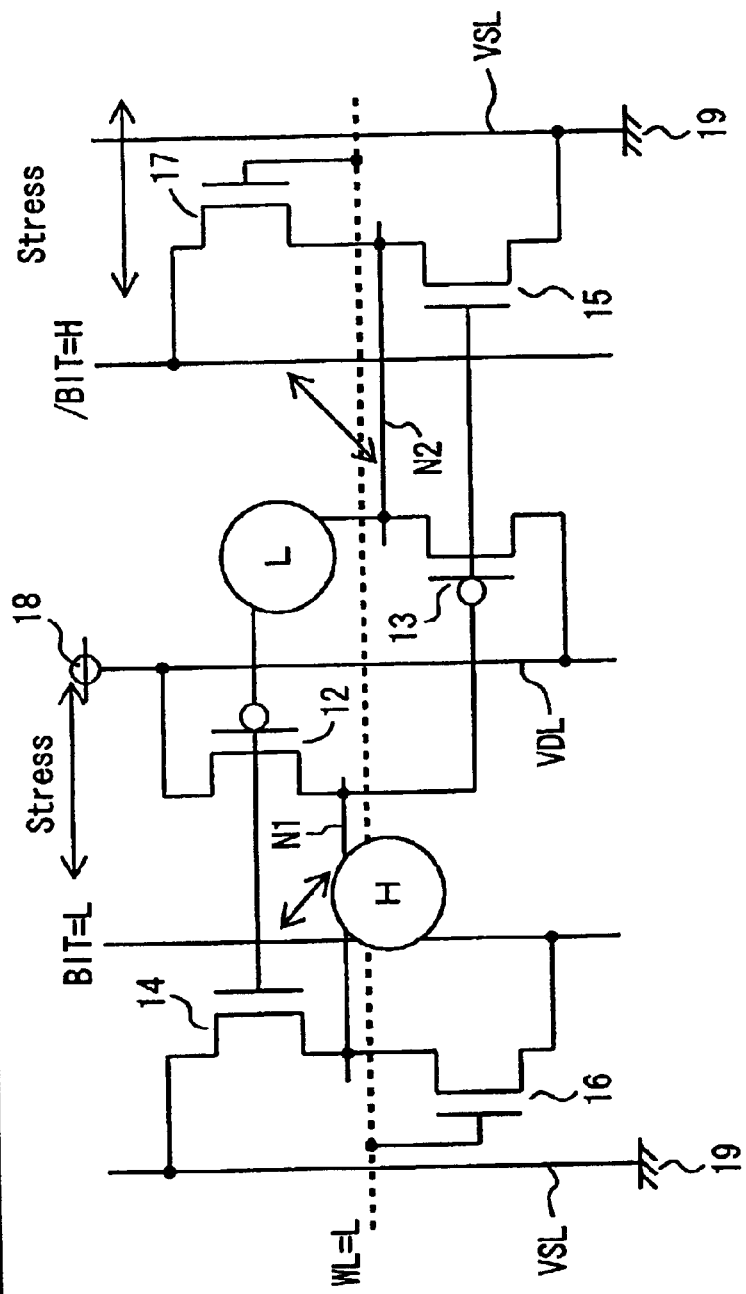
FIG. 25 is a still further illustration showing stresses applied on the static random access memory.

Referring to FIG. 25, description will be given of a stress applied when test pattern 5-B is performed. Note that a double-headed arrow mark indicates a stress. In this case, all of word lines are caused to be in non-selected state, bit line BIT is held at L level while bit line /BIT is held at H level.

In such a situation, stresses are applied between adjacent lines and nodes in each of all memory cells: bit line BIT and power supply line VDL, ground line VSL and bit line /BIT, node N1 and bit line BIT, and node N2 and bit line /BIT.

Figure 26:
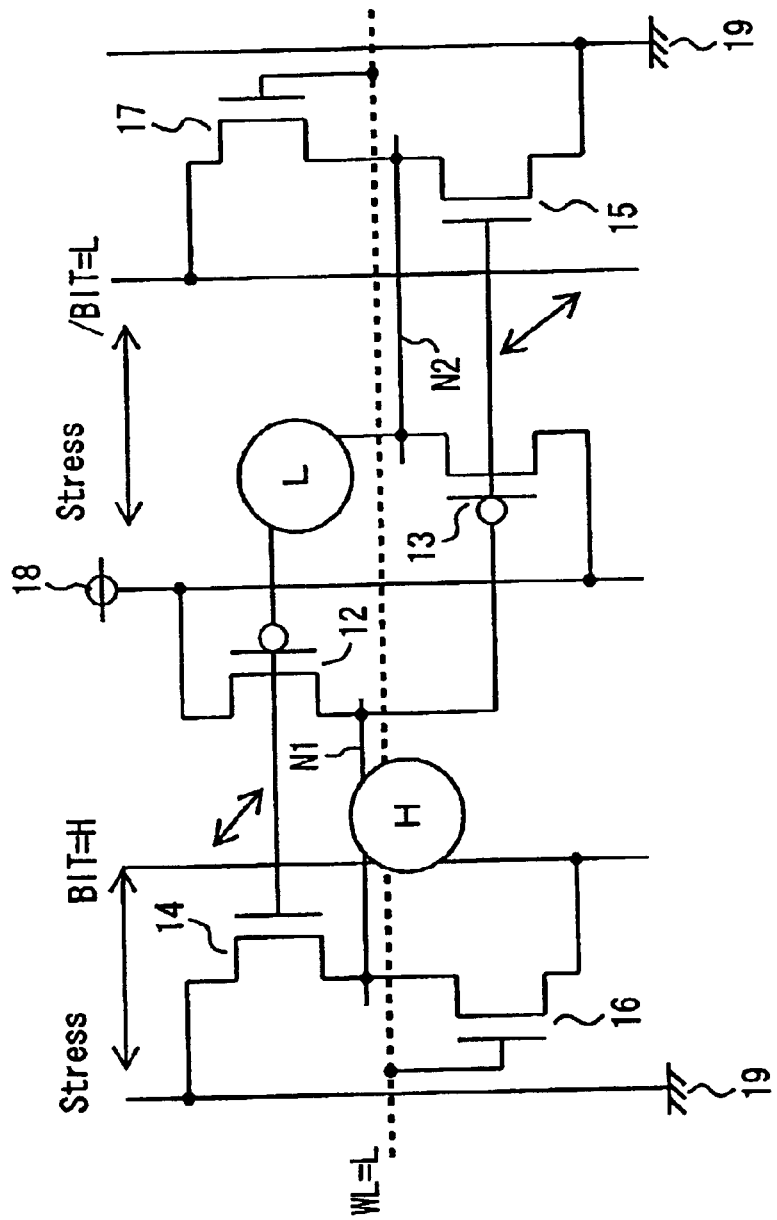
FIG. 26 is a yet further illustration showing stresses applied on the static random access memory.

Referring to FIG. 26, description will be given of a stress applied when test pattern 5-C is performed. Note that a double-headed arrow mark indicates a stress. In this case, all of word lines are selected, bit line BIT is held at H level while bit line /BIT is held at L level.

In such a situation, stresses are applied between adjacent lines and nodes in all of memory cells: bit line BIT and ground line VSL, power supply line VDL and bit line /BIT, node N1 and bit line /BIT, and node N2 and bit line BIT.

Test patterns 6 and 7 are operations in which all of word lines and all of bit line pairs are caused to be in non-selected, whereas only global word lines and global bit line pairs are activated. Since global word lines and a global bit line pair are placed in parallel to each other, stresses are applied between the global word lines and the global bit line pair when each of the test patterns is implemented.

In operation of each of the test pattern, cut-off are required between bit line pairs BITi0 and /BITi0 to BITim and /BITim and global bit line pairs GBL0 and /GBL0 to GBLm and /GBLm, while connection are required between global bit line pairs GBL0 and /GBL0 to GBLm and /GBLm and input/output lines IO and /IO. Therefore, Y gates 240 to 24m are activated by respective column address Y0 to Ym to connects global bit line pairs GBL0 and /GBL0 to GBLm and /GBLm to input/output lines IO and /IO and in addition, invert column address Y0 to Ym to output column address /Y0 to /Ym.

On the other hand, control circuit 110 sets signal BLK0 or sense amplifier activation signal SE1 to L level. Then, activation circuit 34A outputs block-specific sense amplifier activation signal S(0) at L level to turn off N-channel MOS transistors NC3 of input/output circuits 210 to 21m. As a result, input/output circuits 210 to 21m perform cut off between bit line pairs BITi0 and BITi0 to BITim and /BITim and global bit line pairs GBL0 and /GBL0 to GBLm and /GBLm.

It is also understood from plan views shown in FIGS. 10 to 15 and sectional views shown in FIGS. 16 to 19 that the above described stresses are applied by performing operations of test patterns 1 to 5, 5-B, 5-C, 6 and 7 shown in Table 1.

Table 2 shows a test pattern in which stresses are applied between an even-numbered word line and other lines or an odd-numbered word line and other lines.

TABLE 2

|  | GND | Vdd | Bit "H" | Bit "L" | /Bit "H" | /Bit "L" |
|---|---|---|---|---|---|---|
| Even-Numbered WL | 1, 3 | 2, 4 | 4 | 3 | 2 | 1 |
| Odd-Numbered WL | 2, 4 | 1, 3 | 1 | 2 | 3 | 4 |

In test patterns 1 to 5, stresses are applied to even-numbered word lines or odd-numbered word lines, wherein the even-numbered word lines or odd-numbered word lines are simultaneously selected. Note that the reason why test pattern 5 is not shown in Table 2 is that the test pattern is the same as test pattern 1.

Table 3 shows a test pattern in which stresses are applied to nodes N1 and N2 of memory cells connected to an even-numbered word line or nodes N1 and N2 of memory cells connected to an odd-numbered word line.

TABLE 3

|  |  | GND | Vdd | WL "H" | WL "L" | Opposing Adjacent Nodes | Bit | /Bit |
|---|---|---|---|---|---|---|---|---|
| Even-Numbered Row | N1 | 1, 2, 5 | 3, 4 | 3 | 2 | 2, 4 | 2, 4, 5B | 5C |
|  | N2 | 3, 4 | 1, 2, 5 | 1, 5 | 4 | 2, 4 | 5C | 2, 4, 5B |
| Odd-Numbered Row | N1 | 4, 5 | 2, 3 | 2 | 5 | 2, 4 | 5B | 3, 5, 5C |
|  | N2 | 2, 3 | 4, 5 | 4 | 3 | 2, 4 | 3, 5, 5C | 5B |

[Operation Performing Test Pattern 1]

Description will be given of operation performing test pattern 1. In this case, column address Y0 to Ym and address ADB1 for activating Y gates 240 to 24m are inputted to semiconductor memory device 100. Control circuit 110, when receiving address ADB1, detects a transition request to burn-in test mode of test pattern 1 to generate burn-in test signals BI, and BI_0 at H level, signals BI_X, BI_Y and BLK at H level, signal ACT, burn-in test signal BI_1 at L level and sense amplifier activation signal SE1 at H level. Note that signal BLK includes BLK0 to BLK7 corresponding to blocks 21, 24, 27, 30, 33, 36, 39 and 42. Signal ACT has a period at H level longer in burn-in test mode than in ordinary operation mode as described above.

Control circuit 110 outputs burn-in test signals BI and BI_0 at H level, and burn-in test signal BI_1 at L level to predecoder 120, outputs signals BLK and ACT to select circuits 45 to 48, outputs signals BLK (BLK0 to BLK7) at H level to activation circuits 34A included in respective corresponding block 21, 24, 27, 30, 33, 36, 39 and 42, outputs sense amplifier activation signal at H level to activation circuits 34A included in corresponding block 21, 24, 27, 30, 33, 36, 39 and 42, outputs signal BI_X at H level to global decoders 91 and 94 and outputs signal BI_Y at H level to global Y decoders 92 and 95.

Then, predecoder 120, following the above operation, outputs signals X210[0], X210[2], X210[4] and X210[6] at H level, and signals X210[1], X210[3], X210[5] and X210[7] at L level to select circuits 45 to 48.

Select circuit 45, following the above operation, outputs signals at H level to gates 2210, 2212, 2214 and 2216 included in each of gate circuits 221 to 22n of gate circuit groups 22 and 34 and signals at L level to gates 2211, 2213, 2215 and 2217 included therein, on the basis of signals X210[0], X210[2], X210[4] and X210[6] at H level, and signals X210[1], X210[3], X210[5] and X210[7] at L level.

Select circuit 46, following the above operation, outputs signals at H level to gates 2210, 2212, 2214 and 2216 and signals at L level to gates 2211, 2213, 2215 and 2217, included in each of gate circuits 221 to 22n of gate circuit groups 25 and 37 on the basis of signals X210[0], X210[2], X210[4] and X210[6] at H level, and signals X210[1], X210[3], X210[5] and X210[7] at L level.

Select circuit 47, following the above operation, outputs signals at H level to gates 2210, 2212, 2214 and 2216 and signals at L level to gates 2211, 2213, 2215 and 2217, included in each of gate circuits 221 to 22n of gate circuit groups 28 and 40 on the basis of signals X210[0], X210[2], X210[4] and X210[6] at H level, and signals X210[1], X210[3], X210[5] and X210[7] at L level.

Select circuit 48, following the above operation, outputs signals at H level to gates 2210, 2212, 2214 and 2216 and signals at L level to gates 2211, 2213, 2215 and 2217, included in each of gate circuits 221 to 22n of gate circuit groups 31 and 43 on the basis of signals X210[0], X210[2], X210[4] and X210[6] at H level, and signals X210[1], X210[3], X210[5] and X210[7] at L level.

On the other hand, global row decoder 91, following the above operation, activates all of global word lines GWL1 to GWLn and GWLS on the basis of signal BI_X at H level. Global row decoder 94 activates all of global word lines GWL1 to GWLn and GWLS , following the same operation as global row decoder 91.

Gates 2210, 2212, 2214 and 2216 included in each of gate circuits 221 to 22n of gate circuit groups 22, 25, 28, 31, 34, 37, 40 and 43, following the above operation, selects word lines WL0, WL2, WL4 and WL6, while gates 2211, 2213, 2215 and 2217 included therein, following the above operation, cause word lines WL1, WL3, WL5 and WL7 to be in non-selected state.

Thereby, even-numbered word lines included in blocks 21, 24, 27, 30, 33, 36, 39 and 42 are simultaneously selected.

Global Y decoders 92 and 95, following the above operation, select (activate) all of global bit line pairs GBL0 to GBLm and GBLS on the basis of signal BI_Y at H level. Thereby, all of global bit line pairs GBL0 to GBLm and GBLS included in blocks 21, 24, 27, 30, 33, 36, 39 and 42 are simultaneously selected (activated).

Y gates 240 to 24m included in input/output peripheral circuits 23, 26, 29, 32, 35, 38, 41 and 44 are activated in response to respective column addresses Y0 to Ym to connect global bit line pairs GBL0 to GBLm to input/output lines IO and /IO. Eight input/output circuits 210 to 21m included in blocks 21, 24, 27, 30, 33, 36, 39 and 42 are activated in response to respective block-specific sense amplifier activation signals S(0) to S(7) at H level outputted from activation circuit 34A.

Thereafter, data "1" is externally inputted to semiconductor memory device 100 and read register/write drivers 51 and 52 write write data "1" onto input/output lines IO and /IO through sense amplifier SA1 included in input/output peripheral circuits 23, 26, 29, 32, 35, 38, 41 and 44. Thereby, write data "1" is written to global bit line pairs GBL0 to GBLm (global bit line pairs GBL0 and /GBL0 to GBLm and /GBLm) from input/output lines IO and /IO through Y gates 240 to 24m. In blocks 21, 24, 27, 30, 33, 36, 39 and 42, input/output circuits 210 to 21m write write data "1" onto bit line pairs BITi0 and /BITi0 to BITim and /BITim from global bit line pairs GBL0 and /GBL0 to GBLm and /GBLm to further write data "1" to memory cells connected to even-numbered word lines of blocks 21, 24, 27, 30, 33, 36, 39 and 42.

With such an operation, stresses shown in FIG. 20 are applied to semiconductor memory device 100.

[Operation Performing Test Pattern 2]

Description will be given of operation performing test pattern 2. In this case, column address Y0 to Ym and address ADB2 for activating Y gates 240 to 24m are inputted to semiconductor memory device 100. Control circuit 110, when receiving address ADB2, detects a transition request to burn-in test mode of test pattern 2 to generate burn-in test signals BI and BI_1 at H level, signals BI_X, BI_Y and BLK at H level, signal ACT, burn-in test signal BI_0 at L level and sense amplifier activation signal SE1 at H level.

Control circuit 110 outputs burn-in test signals BI and BI_1 at H level, and burn-in test signal BI_0 at L level to predecoder 120, outputs signals BLK and ACT to select circuits 45 to 48, outputs signals BLK (BLK0 to BLK7) at H level to activation circuits 34A included in respective corresponding block 21, 24, 27, 30, 33, 36, 39 and 42, outputs sense amplifier activation signal SE1 at H level to activation circuits 34A included in corresponding block 21, 24, 27, 30, 33, 36, 39 and 42, outputs signal BI_X at H level to global decoders 91 and 94 and outputs signal BI_Y at H level to global Y decoders 92 and 95.

Then, predecoder 120, following the above operation, outputs signals X210[1], X210[3], X210[5] and X210[7] at H level, and signals X210[0], X210[2], X210[4] and X210 [6] at L level to select circuits 45 to 48.

Select circuit 45, following the above operation, outputs signals at H level to gates 2211, 2213, 2215 and 2217 included in each of gate circuits 221 to 22n of gate circuit groups 22 and 34 and signals at L level to gates 2210, 2212, 2214 and 2216 included therein, on the basis of signals X210[1], X210[3], X210[5] and X210[7] at H level, and signals X210[0], X210[2], X210[4] and X210[6] at L level.

Select circuit 46, following the above operation, outputs signals at H level to gates 2211, 2213, 2215 and 2217 included in each of gate circuits 221 to 22n of gate circuit groups 25 and 37 and signals at L level to gates 2210, 2212, 2214 and 2216 included therein, on the basis of signals X210[1], X210[3], X210[5] and X210[7] at H level, and signals X210[0], X210[2], X210[4] and X210[6] at L level.

Select circuit 47, following the above operation, outputs signals at H level to gates 2211, 2213, 2215 and 2217 included in each of gate circuits 221 to 22n of gate circuit groups 28 and 40 and signals at L level to gates 2210, 2212, 2214 and 2216 included therein, on the basis of signals X210[1], X210[3], X210[5] and X210[7] at H level, and signals X210[0], X210[2], X210[4] and X210[6] at L level.

Select circuit 48, following the above operation, outputs signals at H level to gates 2211, 2213, 2215 and 2217 included in each of gate circuits 221 to 22n of gate circuit groups 31 and 43 and signals at L level to gates 2210, 2212, 2214 and 2216 included therein, on the basis of signals X210[1], X210[3], X210[5] and X210[7] at H level, and signals X210[0], X210[2], X210[4] and X210[6] at L level.

On the other hand, global row decoder 91, following the above operation, activates all of global word lines GWL1 to GWLn and GWLS on the basis of signal BI_X at H level. Global row decoder 94 activates all of global word lines GWL1 to GWLn and GWLS, following the same operation as global row decoder 91.

Gates 2211, 2213, 2215 and 2217 included in each of gate circuits 221 to 22n of gate circuit groups 22, 25, 28, 31, 34, 37, 40 and 43, following the above operation, selects word lines WL1, WL3, WL5 and WL7, while gates 2210, 2212, 2214 and 2216 included therein, following the above operation, cause word lines WL0, WL2, WL4 and WL6 to be in non-selected state.

Thereby, odd-numbered word lines included in blocks 21, 24, 27, 30, 33, 36, 39 and 42 are simultaneously selected.

Global Y decoders 92 and 95, following the above operation, select (activate) all of global bit line pairs GBL0 to GBLm and GBLS on the basis of signal BI_Y at H level.

Thereby, all of global bit line pairs GBL0 to GBLm and GBLS included in blocks 21, 24, 27, 30, 33, 36, 39 and 42 are simultaneously selected (activated).

Y gates 240 to 24m included in input/output peripheral circuits 23, 26, 29, 32, 35, 38, 41 and 44 are activated in response to column address Y0 to Ym, respectively, to connect global bit line pairs GBL0 to GBLm to input/output lines IO and /IO. Eight input/output circuits 210 to 21m included in blocks 21, 24, 27, 30, 33, 36, 39 and 42 are activated in response to respective block-specific sense amplifier activation signals S(0) to S(7) at H level outputted from activation circuit 34A.

Thereafter, data "0" is externally inputted to semiconductor memory device 100 and read register/write drivers 51 and 52 write write data "0" onto input/output lines IO and /IO through sense amplifier SA1 included in input/output peripheral circuits 23, 26, 29, 32, 35, 38, 41 and 44. Thereby, write data "0" is written to global bit line pairs GBL0 to GBLm (global bit line pairs GBL0 and /GBL0 to GBLm and /GBLm) from input/output lines IO and /IO through Y gates 240 to 24m. In blocks 21, 24, 27, 30, 33, 36, 39 and 42, input/output circuits 210 to 21m write write data "0" onto bit line pairs BITi0 and /BITi0 to BITim and /BITim from global bit line pairs GBL0 and /GBL0 to GBLm and /GBLm to further write data "0" to memory cells connected to odd-numbered word lines of blocks 21, 24, 27, 30, 33, 36, 39 and 42.

With such an operation, stresses shown in FIG. 21 are applied to semiconductor memory device 100.

[Operation Performing Test Pattern 3]

Description will be given of operation performing test pattern 3.

In this case, column address Y0 to Ym and address ADB3 for activating Y gates 240 to 24m are inputted to semiconductor memory device 100. Control circuit 110, when receiving address ADB3, detects a transition request to burn-in test mode of test pattern 3.

Thereafter, even-numbered word lines are selected and an operation till all of global bit line pairs GBL0 and /GBL0 to GBLm and /GBLm and bit line pairs BITi0 and /BITi0 to BITim and /BITim are selected (activated) is the same as a corresponding part of the operation of [Operation performing test pattern 1].

When even-numbered word lines are selected and all of global bit line pairs GBL0 and /GBL0 to GBLm and /GBLm and bit line pairs BITi0 and /BITi0 to BITim and /BITim are selected (activated), data "0" is externally inputted to semiconductor memory device 100 and read register/write drivers 51 and 52 write write data "0" to input/output lines IO and /IO through sense amplifier SA1 included in input/output peripheral circuits 23, 26, 29, 32, 35, 38, 41 and 44. Thereafter, data "0" is written, following the same operation as in [Operation performing test pattern 2], to memory cells connected to even-numbered word lines included in blocks 21, 24, 27, 30, 33, 36, 39 and 42. At this time point, data "0" is written to all of memory cells (ALL_0).

With such an operation, stresses shown in FIG. 22 are applied to semiconductor memory device 100.

[Operation Performing Test Pattern 4]

Description will be given of operation performing test pattern 4.

In this case, column address Y0 to Ym and address ADB4 for activating Y gates 240 to 24m are inputted to semiconductor memory device 100. Control circuit 110, when receiving address ADB4, detects a transition request to burn-in test mode of test pattern 4.

Thereafter, odd-numbered word lines are selected and an operation till all of global bit line pairs GBL0 and /GBL0 to GBLm and /GBLm and bit line pairs BITi0 and /BITi0 to BITim and /BITim are selected (activated) is the same as a corresponding part of the operation of [Operation performing test pattern 2].

When odd-numbered word lines are selected and all of global bit line pairs GBL0 and /GBL0 to GBLm and /GBLm and bit line pairs BITi0 and /BITi0 to BITim and /BITim are selected (activated), data "1" is externally inputted to semiconductor memory device 100 and read register/write drivers 51 and 52 write write data "1" to input/output lines IO and /IO through sense amplifier SA1 included in input/output peripheral circuits 23, 26, 29, 32, 35, 38, 41 and 44. Thereafter, data "1" is written, following the same operation as in [Operation performing test pattern 1], to memory cells connected to odd-numbered word lines included in blocks 21, 24, 27, 30, 33, 36, 39 and 42.

With such an operation, stresses shown in FIG. 23 are applied to semiconductor memory device 100.

[Operation Performing Test Pattern 5]

Description will be given of operation performing test pattern 5.

In this case, column address Y0 to Ym and address ADB5 for activating Y gates 240 to 24m are inputted to semiconductor memory device 100. Control circuit 110, when receiving address ADB5, detects a transition request to burn-in test mode of test pattern 5.

Thereafter, even-numbered word lines are selected and an operation till all of global bit line pairs GBL0 and /GBL0 to GBLm and /GBLm and bit line pairs BITi0 and /BITi0 to BITim and /BITim are selected (activated) is the same as a corresponding part of the operation of [Operation performing test pattern 1].

When even-numbered word lines are selected and all of global bit line pairs GBL0 and /GBL0 to GBLm and /GBLm and bit line pairs BITi0 and /BITi0 to BITim and /BITim are selected (activated), data "1" is externally inputted to semiconductor memory device 100 and read register/write drivers 51 and 52 write write data "1" to input/output lines IO and /IO through sense amplifier SA1 included in input/output peripheral circuits 23, 26, 29, 32, 35, 38, 41 and 44. Thereafter, data "1" is written, following the same operation as in [Operation performing test pattern 1], to memory cells connected to even-numbered word lines included in blocks 21, 24, 27, 30, 33, 36, 39 and 42. At this time point, data "1" is written to all of memory cells (ALL_10).

With such an operation, stresses shown in FIG. 24 are applied to semiconductor memory device 100.

[Operation Performing Test Pattern 5-B]

Description will be given of operation performing test pattern 5-B.

In this case, column address Y0 to Ym and address ADB6 for activating Y gates 240 to 24m are inputted to semiconductor memory device 100. Control circuit 110, when receiving address ADB6, detects a transition request to burn-in test mode of test pattern 5-B to generate burn-in test signal level BI at H level, burn-in test signals BI_0 and BI_1 at L level, a signal BI_X at L level, signals BLK and BI_Y at H level and sense amplifier activation signal S(0) to S(7) at H level.

Control circuit 110 outputs burn-in test signal BI at H level and burn-in test signals BI_0 and BI_1 at L level to predecoder 120, outputs signals BLK at H level to select circuits 45 to 48, outputs signals BLK (BLK0 to BLK7) and sense amplifier activation signals S(0) to S(7) at H level to activation circuits 34A included in respective corresponding blocks 21, 24, 27, 30, 33, 36, 39 and 42, and outputs signal BI_X at L level to gate circuits 221 to 22n included in each of gate circuit groups 22, 25, 28, 31, 34, 37, 40 and 43.

Then, predecoder 120, following the above operation, outputs signals X210[0] to X210[7] at L level to select circuits 45 to 48.

Select circuit 45, following the above operation, outputs signals at L level to gates 2210 to 2217 included in each of gates circuits 221 to 22n of gate circuit groups 22 and 34.

Select circuit 46, following the above operation, outputs signals at L level to gates 2210 to 2217 included in each of gates circuits 221 to 22n of gate circuit groups 25 and 37.

Select circuit 47, following the above operation, outputs signals at L level to gates 2210 to 2217 included in each of gates circuits 221 to 22n of gate circuit groups 28 and 40.

Select circuit 48, following the above operation, outputs signals at L level to gates 2210 to 2217 included in each of gates circuits 221 to 22n of gate circuit groups 31 and 43.

In each of gate circuits 221 to 22n of gate circuit groups 28 and 40, NAND gate 2218 outputs a signal at H level on the basis of signal BI_X at L level and inverter 2219 outputs a signal at L level. Then, in each of gate circuits 221 to 22n, N-channel MOS transistor 71 of gates 2210 to 2217 is turned off, while P-channel MOS transistor 72 is turned on. As a result, node N0 is supplied with power supply voltage from power supply node NVD to rise to H level. Inverter 73 of gates 2210 to 2217 outputs the signal at L level obtained by inverting a signal at H level to cause all word lines WL0 to WL7 included in blocks 21, 24, 27, 30, 33, 36, 39 and 42 to be in a non-selected state.

On the other hand, global bit line pairs GBL0 and /GBL0 to GBLm and /GBLm and bit line pairs BITi0 and /BITi0 to BITim and /BITim are activated in the same operation as the operation of [Operation performing test pattern 1] described above.

Then, data "0" is externally inputted to semiconductor memory device 100 and read register/write drivers 51 and 52 write data "0" to input/output lines IO and /IO through sense amplifier SA1 included in input/output peripheral circuits 23, 26, 29, 32, 35, 38, 41 and 44. Y gates 240 to 24m included in input/output peripheral circuits 23, 26, 29, 32, 35, 38, 41 and 44 write data "0" written on input/output lines IO and /IO onto global bit line pairs GBL0 and /GBL0 to GBLm and /GBLm. In this case, global bit lines GBL0 to GBLm are held at L level while global bit lines /GBL0 to /GBLm are held at H level.

In each of blocks 21, 24, 27, 30, 33, 39, and 42, eight input/output circuits 210 to 21m are activated in response to respective corresponding block-specific amplifier activation signals SE(0) to SE(7) outputted from activation circuit 34A to write signals at L level on global bit lines GBL0 to GBLm onto bit lines BITi0 to BITim and to write signals at H level on global bit lines /GBL0 to /GBLm onto bit lines /BITi0 to /BITim. With such an operation, stresses shown in FIG. 25 are applied to semiconductor memory device 100.

[Operation Performing Test Pattern 5-C]

Description will be given of operation performing test pattern 5-C.

In this case, column address Y0 to Ym and address ADB7 for activating Y gates 240 to 24m are inputted to semiconductor memory device 100. Control circuit 110, when receiving address ADB7, detects a transition request to burn-in test mode of test pattern 5-C.

Thereafter, all of word lines are caused to be in non-selected state and an operation till all of global bit line pairs GBL0 and /GBL0 to GBLm and /GBLm and bit line pairs BITi0 and /BITi0 to BITim and /BITim are selected (activated) is the same operation as a corresponding part of the operation of [Operation performing test pattern 5-B].

When all of word lines are caused to be in non-selected state and all of global bit line pairs GBL0 and /GBL0 to GBLm and /GBLm and bit line pairs BITi0 and /BITi0 to BITim and /BITim are selected (activated), data "1" is externally inputted to semiconductor memory device 100 and read register/write drivers 51 and 52 write write data "1" to input/output lines IO and /IO through sense amplifier SA1 included in input/output peripheral circuits 23, 26, 29, 32, 35, 38, 41 and 44. Y gates 240 to 24m included in input/output circuits 23, 26, 29, 32, 35, 38, 41 and 44 write data "1" written on input/output lines IO and /IO onto global bit line pairs GBL0 and /GBL0 to GBLm and /GBLm. In this case, global bit lines GBL0 to GBLm are held at H level, while global bit lines /GBL0 to /GBLm are held at L level.

In each of blocks 21, 24, 27, 30, 33, 36, 39 and 42, eight input/output circuits 210 to 21m are activated in response to respective corresponding block-specific amplifier activation signals SE(0) to SE(7) outputted from activation circuit 34A to write signals at H level on global bit lines GBL0 to GBLm onto bit lines BITi0 to BITim, while to write signals at L level on global bit lines /GBL0 to /GBLm onto bit lines /BITi0 to /BITim.

With such an operation, stresses shown in FIG. 26 are applied to semiconductor memory device 100.

[Operation Performing Test Pattern 6]

Description will be given of operation performing test pattern 6.

In this case, column address and address ADB8 for causing (deactivating) global bit line pairs GBL0 to GBLm to be in non-selected state are inputted to semiconductor memory device 100. Control circuit 110, when receiving address ADB8, detects a transition request to burn-in test mode of test pattern 6 to generate burn-in test signal BI at H level, burn-in test signals BI_0 and BI_1 at L level, a signal BI_X at H level, signals BLK and BI_Y at L level and sense amplifier activation signals S(0) to S(7) at L level.

Then, global word lines GWL1 to GWLn are activated following the above described operation.

On the other hand, global Y decoders 92 ad 95 cause (deactivate) all of global bit line pairs GBL0 to GBLm to be in non-selected state on the basis of signal BI_Y at L level and column address. In input/output peripheral circuits 23, 26, 29, 32, 35, 38, 41 and 44, eight input/output circuits 210 to 21m are deactivated in response to respective corresponding block-specific sense amplifier activation signals SE(0) to SE(7) at L level outputted from activation circuit 34A. Thereby, all of bit line pairs BITi0 and /BITi0 to BITim and /BITim are caused to be in non-selected state (deactivated).

Then, stresses are applied between global word lines GWL1 to GWLn and global bit line pairs GBL0 to GBLm, both are placed in parallel to each other.

[Operation Performing Test Pattern 7]

Description will be given of operation performing test pattern 7.

In this case, row address and address ADB9 for causing (deactivating) global word lines GWL1 to GWLn to be in non-selected state are inputted to semiconductor memory device 100. Control circuit 110, when receiving address ADB9, detects a transition request to burn-in test mode of test pattern 7 to generate burn-in test signal BI at H level, burn-in test signals BI_0 and BI_1 at L level, signals BI_X and BLK at L level, a signal BI_Y at H level and sense amplifier activation signals at L level S(0) to S(7).

Then, all of word lines, following the above operation, are caused to be in non-selected state.

On the other hand, global row decoders 91 and 94 cause all of global word lines GWL1 to GWLn to be in non-selected state on the basis of signal BI_X at L level and row address. Global Y decoders 92 and 95, following the above operation, select (activate) all of global bit line pairs GBL0 to GBLm on the basis of signal BI_Y at H level. In input/output peripheral circuits 23, 26, 29, 32, 35, 38, 41 and 44, eight input/output circuits 210 to 21m are deactivated in response to respective corresponding block-specific sense amplifier activation signals SE(0) to SE(7) at L level outputted from activation circuit 34A. Thereby, all of bit line pairs BITi0 and /BITi0 to BITim and /BITim are caused to be in non-selected state (deactivated).

Thereby, stresses are applied between global word lines GWL1 to GWLn and global bit line pairs GBL0 to GBLm, both placed in parallel to each other.

In the present invention, as described above, test patterns 1 to 5, 5-B, 5-C, 6 and 7 are consecutively executed to apply the stresses described above consecutively to semiconductor memory device 100.

In such a manner, the present invention has a feature that, by applying plural stresses consecutively, a burn-in test is achieved.

Note that an operation in which data is inputted/outputted to/from memory cells in ordinary operation mode is effected in a procedure that control circuit 110 generates burn-in test signal BI at L level and signals BI_X and BI_Y at L level, plural word lines are sequentially selected according to a row address, plural global bit line pairs and plural bit line pairs are sequentially selected according a column address.

Referring to FIG. 27, description will be given of a test method of semiconductor memory device 100. A test method of semiconductor memory device 100 includes a test 1 determining pass/fail of an as-fabricated device (step S10), a burn-in test (step S20) and a test 2 determining pass/fail of the device (step S30).

At the start of test of semiconductor memory device 100, there is performed test 1 determining pass/fail of an as-fabricated device. At the first stage of test 1, data is inputted/outputted to/from memory cells at timings with a margin (step S11). Then, pass/fail is determined on the device on test on the basis of information on whether or not read data from each of memory cells coincides with write data (step S12). Thereafter, a detected defective cell is replaced with a redundant good cell (step S13), thereby ending test 1.

After test 1, burn-in test is performed (step S20). When burn-in test gets started, stresses are applied by writing data "1" to memory cells connected to even-numbered word lines (step S21). That is, test pattern 1 described above is implemented.

Then, stresses are applied by writing data "0" to memory cells connected to odd-numbered word lines (step S22). That is, test pattern 2 described above is implemented.

In succession, stresses are applied by writing data "0" to memory cells connected to even-numbered word lines (step S23). That is, test pattern 3 described above is implemented and stresses are applied by writing data "0" to all the memory cells.

In succession, stresses are applied by writing data "1" to memory cells connected to odd-numbered word lines (step S24). That is, test pattern 4 described above is implemented.

In succession, stresses are applied by writing data "1" to memory cells connected to even-numbered word lines (step S25). That is, test pattern 5 described above is implemented and stresses are applied by writing data "1" to all the memory cells.

In succession, stresses are applied by causing all word lines to be in non-selected state and holding bit line /BIT at H level and bit line BIT at L level (step S26). That is, test pattern 5-B described above is implemented.

In succession, stresses are applied by causing all word lines to be in non-selected state and holding bit line BIT at H level and bit line /BIT at L level (step S27). That is, test pattern 5-C described above is implemented.

In succession, stresses are applied by causing all word lines and all bit line pairs to be in non-selected state and holding global bit line pairs (global Y lines) at H level (step S28). That is, test pattern 6 described above is implemented.

In succession, stresses are applied by causing all word lines and all bit line pairs to be in non-selected state and holding global word lines (global X lines) at H level (step S29). That is, test pattern 7 described above is implemented.

With test pattern 7 implemented, the burn-in test is completed, followed by test 2.

After the burn-in test, data is inputted/outputted to/from memory cells at timings with a margin (step S31). Then, pass/fail is determined on the tested device on the basis of information on whether or not read data coincides with write data (step S32) and a defective cell is replaced with a redundant good cell (step S33). Thereafter, a timing in operation is restored to an ordinary operation to perform operation check to finally judge pass/fail of the device (step S34).

With step S34 performed, the tests of semiconductor memory device 100 are fully completed.

Note that step 20 of a flowchart shown in FIG. 27 is the contents of wafer burn-in in a wafer test and regular burn-in in a final test.

Steps S21 to S25 are a procedure in which even-numbered word lines and odd-numbered word lines in set are alternately selected and data "1" or data "0" is alternately written to memory cells connected to even-numbered word lines and memory cells connected to odd numbered word lines, thereby applying stresses. Therefore, no specific limitation is imposed on increasing order of steps from S21 to S25, but any order of steps may be adopted as far as even-numbered word lines and odd-numbered word lines are alternately selected and data "1" or data "0" is alternately written to memory cells connected to even-numbered word lines and memory cells connected to odd numbered word lines.

In the present invention, "a memory cell" array is constituted of plural memory cells (MC) arranged in a matrix, plural bit line pairs BITi0 and /BITi0, plural global bit line pairs GBL0 and /BGL0 to GBLm to /GBLm, and plural global word lines GWL1 to GWLn.

In the present invention, "a test circuit" applying plural stresses consecutively to a memory cell array is constituted of control circuit 110, predecoder 120, select circuits 45 to 48, gate circuits 221 to 22n included in gate circuit groups 22, 25, 28, 31, 34, 37, 40 and 43, global row decoders 91 and 94 included in decode circuits 9 and 10, global Y decoders 92 and 95 included in decode circuits 9 and 10, write drivers of read register/write drivers 5 to 8, Y gates 240 to 24m included in input/output peripheral circuits 23, 26, 29, 32, 35, 38, 41 and 44, and input/output circuits 210 to 21m included in blocks 21, 24, 27, 30, 33, 36, 39 and 42.

In the present invention, "a word line select circuit" is constituted of select circuits 45 to 48, global row decoders 91 and 94 included in decode circuits 9 and 10, global Y decoders 92 and 95 included in decode circuits 9 and 10, and gate circuits 221 to 22n included in gate circuit groups 22, 25, 28, 31, 34, 37, 40 and 43.

In the present invention, "a select circuit" is constituted of predecoder 120, select circuits 45 to 48, global row decoders 91 and 94 included in decode circuits 9 and 10, global Y decoders 92 and 95 included in decode circuits 9 and 10, and gate circuits 221 to 22n included in gate circuit groups 22, 25, 28, 31, 34, 37, 40 and 43.

In the present invention, "a global word line select circuit" is constituted of global row decoders 91 and 94 included in decode circuits 9 and 10, and "a word line connection circuit" is constituted of gate circuits 221 to 22n included in gate circuit groups 22, 25, 28, 31, 34, 37, 40 and 43.

While in the above description, there is shown a burn-in test for a static random access memory (SRAM), the present invention is not limited to this, but can be applied to DRAM and a flash memory as well.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device comprising:
 a memory cell array, and
 a test circuit consecutively applying plural stresses to said memory cell array in response to a transition request to a burn-in test mode, wherein
 said memory cell array includes:
  m×n (m and n are each a natural number) memory cells arranged in a matrix;
  m word lines extending in a row direction; and
  n bit line pairs extending in a column direction,
 said test circuit includes:
  a peripheral circuit writing data to said memory cell array;
  a select circuit selecting said m word lines; and
  a control circuit generating a transition signal for causing transition to said burn-in test in response to said transition request to output said transition signal to said select circuit,
 said select circuit, in response to said transition signal, selects/does not select said m word lines such that said plural stresses are consecutively applied to said memory cell array, and
 said peripheral circuit, in response to the selection of said word lines, writes a data pattern for applying said plural stresses to memory cells connected to said selected word lines while, in response to the non-selection of said word lines, writing said data pattern to said n bit line pairs.

2. The semiconductor memory device according to claim 1, wherein
 said select circuit selects said m word lines by plural word lines at each time in prescribed order such that the same data is written to all of said m×n memory cells and after writing of the same data, all of said m word lines are caused to be in a non-selected state.

3. The semiconductor memory device according to claim 2, wherein said
 select circuit selects alternately plural even-numbered word lines and plural odd-numbered word lines,
 said peripheral circuit, in response to selection of said plural even-numbered word lines, writes first data to memory cells connected to said plural even-numbered word lines, and, in response to selection of said plural odd-numbered word lines, writing second data different from said first data to memory cells connected to said plural odd-numbered word lines.

4. The semiconductor memory device according to claim 3, wherein
 said transition signal includes first to third burn-in test signals, and said select circuit includes:
a predecoder, in response to said first and second burn-in test signals, generating first select signals for selecting said plural even-numbered word lines, and, in response to said first and third burn-in test signals, generating second select signals for selecting said plural odd-numbered word lines; and
a word line select circuit, in response to said first select signals, selecting said plural even-numbered word lines, and, in response to said second select signals, selecting said plural odd-numbered word lines.

5. The semiconductor memory device according to claim 4, wherein said predecoder includes:
a first select element, in response to said first burn-in test signal, selecting said second burn-in test signal to output said selected second burn-in test signal as said first select signals; and
a second select element, in response to said first burn-in test signal, selecting said third burn-in test signal to output said selected third burn-in test signal as said second select signals.

6. The semiconductor memory device according to claim 2, wherein said memory cell array includes:
j (j: a natural number satisfying k×j=m) global word lines each for being connected to k (k: a natural number satisfying k<m) word lines; and
q (q: a natural number satisfying p×q=n) global bit line pairs placed in parallel to said j global word lines, and each for being connected to p (p: a natural number satisfying p<n) bit line pairs,
said select circuit causes said m word lines to be in non-selected state and in addition, selects/does not select said j global word lines,
said peripheral circuit, in response to selection of said global word lines, writes a first data pattern for applying stresses onto said j global word lines onto said q global bit line pairs, and, in response to non-selection of said global word lines, writes a second data pattern for applying stresses onto said q global bit line pairs onto said q global bit line pairs.

7. The semiconductor memory device according to claim 6, wherein said transition signal includes first to third burn-in test signals, and
said select circuit includes:
a global word line select circuit selecting all of said j global word lines;
a predecoder, in response to said first and second burn-in test, generating first select signals for selecting plural even-numbered word lines of said k word lines, and, in response to said first and third burn-in test, generating second select signals for selecting plural odd-numbered word lines of said k word lines; and
a word line connection circuit, in response to said first select signals, connecting said selected global word lines to said plural even-numbered word lines, and, in response to said second select signals, connecting said selected global word lines to said plural odd-numbered word lines.

8. The semiconductor memory device according to claim 7, wherein said predecoder includes:
a first select element, in response to said first burn-in test signal, selecting said second burn-in test signal to output said selected second burn-in test signal as said first select signals; and
a second select element, in response to said first burn-in test signal, selecting said third burn-in test signal to output said selected third burn-in test signal as said second select signals.

9. The semiconductor memory device according to claim 6, wherein
said burn-in test mode includes first to ninth burn-in test modes with consecutive ordinal numbers,
in said first burn-in test mode,
said select circuit, in response to said transition signal, selects said plural even-numbered word lines, and
said peripheral circuit writes first data to memory cells connected to said selected word line,
in said second burn-in test mode,
said select circuit, in response to said transition signal, selects said plural odd-numbered word lines, and
said peripheral circuit writes second data different from said first data to memory cells connected to said selected word line,
in said third burn-in test mode,
said select circuit, in response to said transition signal, selects said plural even-numbered word lines, and
said peripheral circuit writes said second data to memory cells connected to said selected word line,
in said fourth burn-in test mode,
said select circuit, in response to said transition signal, selects said plural odd-numbered word lines, and
said peripheral circuit writes said first data to memory cells connected to said selected word line,
in said fifth burn-in test mode,
said select circuit, in response to said transition signal, selects said plural even-numbered word lines, and
said peripheral circuit writes said first data to memory cells connected to said selected word line,
in said sixth burn-in test mode,
said select circuit causes said m word lines to be in a non-selected state, and
said peripheral circuit writes said second data onto said n bit line pair's,
in said seventh burn-in test mode,
said select circuit causes said m word lines to be in a non-selected state, and
said peripheral circuit writes said first data onto said n bit line pairs,
in said eighth burn-in test mode,
said select circuit causes said m word lines to be in said non-selected state, and selecting said j global word lines, and
said peripheral circuit writes said second data onto said q global bit line pairs, and
in said ninth burn-in test mode,
said select circuit causes said m word lines and said j global word lines to be in a non-selected state, and
said peripheral circuit writes said first data onto said q global bit line pairs.

10. The semiconductor memory device according to claim 9, wherein each of said m×n memory cells is a memory cell of a static random access memory.

11. The semiconductor memory device according to claim 10, wherein said first data is "1" and said second data is "0".

* * * * *